United States Patent
Kumazawa et al.

(10) Patent No.: US 11,370,857 B2
(45) Date of Patent: Jun. 28, 2022

(54) RESIN COMPOSITION, RESIN SHEET, MULTILAYER PRINTED WIRING BOARD, AND SEMICONDUCTOR DEVICE

(71) Applicant: MITSUBISHI GAS CHEMICAL COMPANY, INC., Tokyo (JP)

(72) Inventors: Yune Kumazawa, Tokyo (JP); Takuya Suzuki, Tokyo (JP); Seiji Shika, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 17/271,745

(22) PCT Filed: Aug. 28, 2019

(86) PCT No.: PCT/JP2019/033681
§ 371 (c)(1),
(2) Date: Feb. 26, 2021

(87) PCT Pub. No.: WO2020/045489
PCT Pub. Date: Mar. 5, 2020

(65) Prior Publication Data
US 2021/0206892 A1    Jul. 8, 2021

(30) Foreign Application Priority Data

Aug. 30, 2018 (JP) .............................. JP2018-161792

(51) Int. Cl.
| | |
|---|---|
| *C08F 22/40* | (2006.01) |
| *C08F 2/50* | (2006.01) |
| *H05K 1/03* | (2006.01) |
| *H05K 1/02* | (2006.01) |
| *G03F 7/028* | (2006.01) |
| *C08K 5/5397* | (2006.01) |
| *H05K 3/46* | (2006.01) |

(52) U.S. Cl.
CPC ................ *C08F 22/40* (2013.01); *C08F 2/50* (2013.01); *C08K 5/5397* (2013.01); *G03F 7/028* (2013.01); *H05K 1/0298* (2013.01); *H05K 1/0326* (2013.01); *H05K 3/4626* (2013.01); *H05K 2201/0154* (2013.01)

(58) Field of Classification Search
CPC .............. C08F 2/48; C08F 2/50; C08F 22/40
See application file for complete search history.

(56) References Cited

U.S. PATENT DOCUMENTS 10,808,103 B2 * 10/2020 Takiguchi .............. C09J 179/04
2004/0029044 A1    2/2004 Severance et al.

FOREIGN PATENT DOCUMENTS

| EP | 3 790 039 A1 | 3/2021 | |
| JP | 2002-080509 A | 3/2002 | |
| JP | 2002-121221 A | 4/2002 | |
| JP | 2005-062450 A | 3/2005 | |
| JP | 2005-535745 A | 11/2005 | |
| JP | 2010-204298 A | 9/2010 | |
| JP | WO 2018/056466 A | 3/2018 | |
| WO | WO 2018/003313 A1 | 1/2018 | |
| WO | WO-2018106531 A1 * | 6/2018 | ............. G03F 7/031 |
| WO | WO 2018/212116 A1 | 11/2018 | |

OTHER PUBLICATIONS

ISR for PCT/JP2019/033681, dated Nov. 12, 2019.

* cited by examiner

*Primary Examiner* — Vu A Nguyen
(74) *Attorney, Agent, or Firm* — Greenblum & Bernstein, P.L.C.

(57) ABSTRACT

A resin composition of the present invention contains: a maleimide compound (A) having a maleimide functional group equivalent of 300 g/eq. or more, and a transmittance of 1% or more at a wavelength of 405 nm (h-line); a maleimide compound (B) having a maleimide functional group equivalent of less than 300 g/eq.; and a photo initiator (C) having an absorbance of 0.1 or more at a wavelength of 405 nm (h-line).

6 Claims, No Drawings

RESIN COMPOSITION, RESIN SHEET, MULTILAYER PRINTED WIRING BOARD, AND SEMICONDUCTOR DEVICE

TECHNICAL FIELD

The present invention relates to a resin composition, and a resin sheet, multilayer printed wiring board, and semiconductor device using the same.

BACKGROUND ART

Due to the downsizing and densification of multilayer printed wiring boards, studies to make the laminate used for multilayer printed wiring boards thinner have been actively carried out. Along with the thinning, the insulating layer also needs to be made thinner, and a resin sheet not containing glass cloth has been demanded. The resin composition used as the material of the insulating layer is mainly a thermosetting resin, and drilling of holes between insulating layers to obtain conduction is generally carried out by laser processing.

Meanwhile, the drilling of holes by laser processing has a problem that the processing time becomes longer as the number of holes in a high density substrate becomes larger. In recent years, therefore, there has been a demand for a resin sheet that also enables batch drilling in the exposure step by using a resin composition that can be cured by exposure with irradiation of rays of light or the like.

As the method of exposure, a method in which a mercury lamp is used as a light source and the exposure is carried out via a photomask is used. Also, in recent years, the introduction of a direct imaging method, in which a pattern is directly drawn on the photosensitive resin composition layer without using a photomask, based on digital data of the pattern, has been progressing as the exposure method. Since this direct imaging method provides better alignment accuracy than the exposure method using a photomask and produces a more detailed pattern, the introduction of this method has been progressing, especially for substrates that require the formation of high density wiring. The light source for this method is a monochromatic light source such as a laser, and in particular, a light source with a wavelength of 405 nm (h-line) is used in devices based on the DMD (Digital Micromirror Device) system, which is capable of forming highly detailed resist patterns.

For the photosensitive resin compositions used in laminates and resin sheets, compounds having an ethylenically unsaturated group, such as (meth)acrylate, are used in order to enable rapid curing in the exposure step.

For example, Patent Document 1 describes a photosensitive thermosetting resin composition containing a carboxyl modified epoxy (meth)acrylate resin, a biphenyl-based epoxy resin, a photo initiator, and a diluent, the carboxyl modified epoxy (meth)acrylate resin being obtained by reacting a bisphenol-based epoxy resin with (meth)acrylic acid and then reacting the resultant with an acid anhydride.

In addition, Patent Document 2 describes a resin composition containing a photocurable binder polymer, a photopolymerization compound having an ethylenically unsaturated bond, a photopolymerization (curing) initiator, a sensitizer, and a bisallylnadic imide compound and a bismaleimide compound, which are thermosetting agents.

Patent Document 3 describes a resin composition containing a bismaleimide compound (a curable resin) and a photo radical polymerization initiator (a curing agent).

CITATION LIST

Patent Document

Patent Document 1: Japanese Patent Laid-Open No. 2005-62450
Patent Document 2: Japanese Patent Laid-Open No. 2010-204298
Patent Document 3: International Publication No. WO 2018/56466 (A1)

SUMMARY OF INVENTION

Technical Problem

However, cured products using conventional (meth)acrylate-based resins do not provide a sufficient physical property, and are limited in forming protective films with high heat resistance and interlayer insulating layers. In addition, these cured products have inferior insulation reliability, such as migration resistance between circuits, and are problematic for use as high density printed wiring boards.

A cured product obtained from the resin composition described in Patent Document 1 is described as having excellent flexibility and folding resistance as a solder resist, and also having excellent heat resistance, but no specific values are given for heat resistance, and thus, it has a problem of inferior heat resistance and thermal stability for use as an interlayer insulating layer. In addition, this cured product also has inferior insulation reliability, such as migration resistance between circuits, and is problematic for use as high density printed wiring boards.

In Patent Document 2, the use of a bismaleimide compound is described as a thermosetting agent, and (meth)acrylate is used as a photopolymerizable compound. Therefore, it has a problem of inferior heat resistance and thermal stability for use as an interlayer insulating layer.

In Patent Document 3, a bismaleimide compound is used as a curable resin, but since the maleimide compound has poor light transmissivity, when the maleimide compound is contained, light does not reach the photo initiator sufficiently, the photo initiator has difficulty generating radicals, and its reactivity is very low. Therefore, in Patent Document 3, the maleimide compound is cured by additional heating. In Patent Document 3, there is no description about using an active energy ray including a wavelength of 405 nm (h-line) as a light source that can be irradiated.

The present invention has been made in view of the problems described above, and an object of the present invention is to provide a resin composition, a resin sheet, a multilayer printed wiring board, and a semiconductor device, wherein the resin composition is light-sensitive and photocurable when exposed with an active energy ray including a wavelength of 405 nm (h-line) and has excellent photocurability, heat resistance, thermal stability, and insulation reliability, especially when used for multilayer printed wiring boards.

Solution to Problem

The present inventors have found that the problems described above can be solved by using a resin composition comprising a particular maleimide compound (A), a particular maleimide compound (B), and a photo initiator (C) having an absorbance of 0.1 or more at a wavelength of 405 nm (h-line), leading to completion of the present invention.

More specifically, the present invention includes the following contents.

[1] A resin composition comprising: a maleimide compound (A) having a maleimide functional group equivalent of 300 g/eq. or more, and a transmittance of 1% or more at a wavelength of 405 nm (h-line); a maleimide compound (B) having a maleimide functional group equivalent of less than 300 g/eq.; and a photo initiator (C) having an absorbance of 0.1 or more at a wavelength of 405 nm (h-line).

[2] The resin composition according to [1], wherein a compounding ratio between the maleimide compound (A) and the maleimide compound (B) ((A):(B)) is 1 to 99:99 to 1 on a mass basis.

[3] The resin composition according to [1] or [2], wherein a content of the maleimide compound (A) and the maleimide compound (B) is 50 to 99.9 parts by mass based on 100 parts by mass in total of the maleimide compound (A), the maleimide compound (B), and the photo initiator (C).

[4] The resin composition according to any of [1] to [3], wherein the photo initiator (C) is a compound represented by the following formula (1).

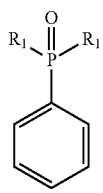

(1)

(In the formula (1), a plurality of $R_1$ each independently represent a substituent represented by the following formula (2) or a phenyl group.).

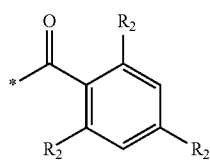

(2)

(In the formula (2), -* shows a bonding site, and a plurality of $R_2$ each independently represent a hydrogen atom or a methyl group.).

[5] A resin sheet comprising: a support; and a resin layer disposed on one surface or both surfaces of the support, wherein the resin layer comprises the resin composition according to any of [1] to [4].

[6] The resin sheet according to [5], wherein the resin layer has a thickness of 1 to 50 μm.

[7] A multilayer printed wiring board comprising the resin composition according to any of [1] to [4].

[8] A semiconductor device comprising the resin composition according to any of [1] to [4].

Advantageous Effects of Invention

According to the present invention, a resin composition, a resin sheet, a multilayer printed wiring board, and a semiconductor device can be provided, wherein the resin composition is light-sensitive and photocurable when exposed with an active energy ray including a wavelength of 405 nm (h-line) and has excellent photocurability, heat resistance, thermal stability, and insulation reliability, especially when used for multilayer printed wiring boards.

DESCRIPTION OF EMBODIMENTS

Hereinafter, an embodiment for carrying out the present invention (hereinafter, referred to as the "present embodiment") will be described in detail. The present embodiment described below is only illustrative of the present invention and is not intended to limit the present invention to the contents of the following description. The present invention can be carried out with appropriate modifications falling within the gist of the invention.

Note that, in the present specification, the term "(meth) acryloyl group" refers to both "acryloyl group" and "methacryloyl group" corresponding thereto, the term "(meth) acrylate" refers to both "acrylate" and "methacrylate" corresponding thereto, and the term "(meth)acrylic acid" refers to both "acrylic acid" and "methacrylic acid" corresponding thereto. Also, in the present embodiment, "resin solid content" or "resin solid content in a resin composition" refers to components in a resin composition excluding a photo initiator (C), an additive agent, a solvent, and a filler unless otherwise noted, and "100 parts by mass of resin solid content" refers to the total of components in a resin composition excluding a photo initiator (C), an additive agent, a solvent, and a filler being 100 parts by mass.

A resin composition of the present embodiment contains: a maleimide compound (A) having a maleimide functional group equivalent of 300 g/eq. or more, and a transmittance of 1% or more at a wavelength of 405 nm (h-line); a maleimide compound (B) having a maleimide functional group equivalent of less than 300 g/eq.; and a photo initiator (C) having an absorbance of 0.1 or more at a wavelength of 405 nm (h-line). Hereinafter, each of these components will be described.

<Maleimide Compound (A)>

In the resin composition of the present embodiment, a maleimide compound (A) (also referred to as the "component (A)") according to the present embodiment is contained. The maleimide compound (A) according to the present embodiment has a maleimide functional group equivalent of 300 g/eq. or more, and a transmittance of 1% or more at a wavelength of 405 nm (h-line).

Normally, since maleimide compounds have poor light transmissivity, when the resin composition contains a maleimide compound, light does not sufficiently reach the photo initiator dispersed in the resin composition, and the photo initiator has difficulty generating radicals. Therefore, in general, the photo radical reaction of maleimide compounds is difficult to proceed, and even if radical polymerization or dimerization reaction of single maleimide proceeds, its reactivity is very low. However, the maleimide compound (A) according to the present embodiment exhibits very excellent light transmissivity, with a transmittance of 1% or more, when a chloroform solution containing the maleimide compound (A) at 1% by mass is prepared and the transmittance of this chloroform solution is measured using a ray of light with a wavelength of 405 nm (h-line). Therefore, sufficient light reaches the photo initiator and the photo radical reaction of the maleimide occurs efficiently. The transmittance is preferably 2% or more, and more preferably 4% or more, because a resin composition that is more excellent in photocurability, heat resistance, and thermal stability can be obtained. Although the upper limit of the transmittance is not particularly limited, for example, it is 99.9% or less.

Meanwhile, even if a maleimide compound having light transmissivity is used, the polymerization does not proceed unless the photopolymerization initiator absorbs the light with a wavelength of 405 nm (h-line) and generates radicals. However, the photo initiator (C) according to the present embodiment, which will be mentioned later, exhibits very excellent absorption of the light with a wavelength of 405 nm (h-line), with an absorbance of 0.1 or more at a wavelength of 405 nm (h-line).

Since the maleimide compound (A) has excellent light transmissivity, as mentioned above, an active energy ray including a wavelength of 405 nm (h-line) reaches the photo initiator sufficiently, and the radical reaction using the radicals generated from the photo initiator proceeds efficiently. Therefore, the maleimide compound (A) according to the present embodiment can be photo-cured together with the maleimide compound (B), which will be mentioned later, and the photo initiator (C), which will be mentioned later, and it is also possible to photo-cure the composition in which a large amount of the maleimide compound (A) is compounded. According to the present embodiment, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used.

And, since a cured material obtained from the resin composition of the present embodiment has excellent photocurability, heat resistance, and thermal stability, a protective film and an insulating layer can be suitably formed.

The maleimide compound (A) according to the present embodiment has a maleimide functional group equivalent of 300 g/eq. or more, preferably 320 g/eq. or more, and more preferably 340 g/eq. or more. Although the upper limit of the maleimide functional group equivalent is not particularly limited, it is preferably 5,000 g/eq. or less from the standpoint of reactivity. In the present embodiment, the maleimide functional group equivalent (g/eq) is calculated from the following expression (1), using the mass average molecular weight of the maleimide compound and the number of functional groups.

maleimide functional group equivalent=(mass average molecular weight of maleimide compound)/(number of functional groups of maleimide compound)　　(1)

In the present embodiment, when the maleimide compound (A) is photo-cured together with the maleimide compound (B), which will be mentioned later, and the photo initiator (C), which will be mentioned later, using an active energy ray including a wavelength of 405 nm (h-line), a resin composition is obtained that has very excellent insulation reliability, in addition to good heat resistance and thermal stability. The reason for this is not certain, but the present inventors estimate it as follows. That is, since the maleimide compound (A) with a maleimide functional group equivalent of 300 g/eq. or more has relatively low water absorbency, it is estimated that, by using this maleimide compound (A), a cured product with excellent insulation reliability can be obtained. Also, since the maleimide compound (B), which has a maleimide functional group equivalent of less than 300 g/eq. has many reaction points, even when the transmittance of a chloroform solution of this compound is measured using a ray of light with a wavelength of 405 nm (h-line) and the transmittance is found to be low, it is quickly photo-cured and a low molecular weight cured product is produced. Then, it is estimated that the cured product produced by the maleimide compound (B) becomes the so-called core, to which the maleimide compound (A) with a high functional group equivalent is suitably crosslinked, thereby providing a cured product with good heat resistance and thermal stability.

Although the maleimide compound (A) is not particularly limited as long as the effects of the present invention are achieved, examples thereof include, for example, a maleimide compound represented by the following formula (3), a maleimide compound represented by the following formula (4), a maleimide compound represented by the following formula (5), a maleimide compound represented by the following formula (6), a maleimide compound represented by the following formula (7), a maleimide compound represented by the following formula (8), and fluorescein-5-maleimide.

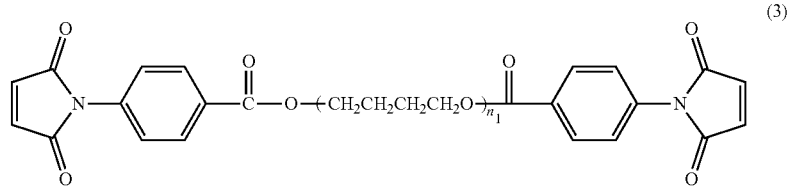

(3)

In the formula (3), $n_1$ (average) is 1 or more, preferably 1 to 21, and from the viewpoint of exhibiting excellent photocurability, more preferably 1 to 16.

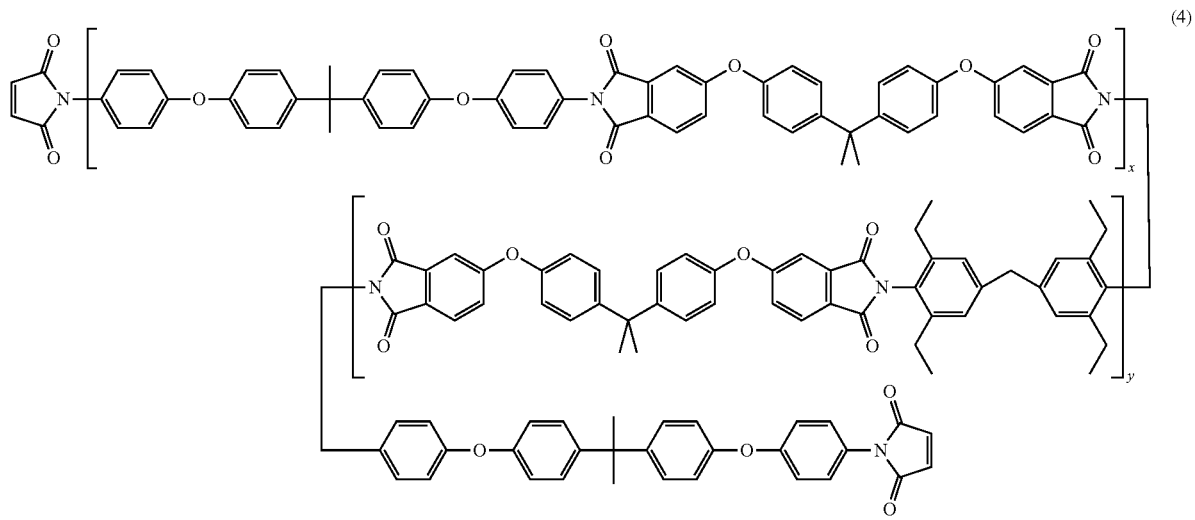

In the formula (4), the value of x is 10 to 35.
In the formula (4), the value of y is 10 to 35.

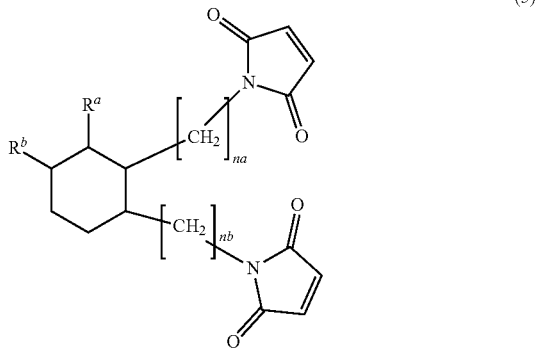

In the formula (5), $R^a$ represents a linear or branched alkyl group having 1 to 16 carbon atoms, or a linear or branched alkenyl group having 2 to 16 carbon atoms. $R^a$ is preferably a linear or branched alkyl group, and more preferably a linear alkyl group because excellent photocurability is exhibited.

The number of carbon atoms in the alkyl group is more preferably 4 to 12 because excellent photocurability is exhibited.

The number of carbon atoms in the alkenyl group is more preferably 4 to 12 because excellent photocurability is exhibited.

Although the alkyl group is not particularly limited as long as the effects of the present embodiment are achieved, examples thereof include, for example, a methyl group, an ethyl group, a n-propyl group, an isopropyl group, a 2,2-dimethylpropyl group, a n-butyl group, an isobutyl group, a sec-butyl group, a t-butyl group, a 2-methylbutyl group, a 3-methylbutyl group, a 2,2-dimethylbutyl group, a n-pentyl group, a neopentyl group, a t-pentyl group, a 2,2-dimethylpentyl group, a n-hexyl group, a 2-hexyl group, a 3-hexyl group, a thexyl group, a n-heptyl group, a 2-heptyl group, a 3-heptyl group, a n-octyl group, a 2-octyl group, a 3-octyl group, a n-ethylhexyl group, a n-nonyl group, a 2-nonyl group, a 3-nonyl group, and a n-decyl group. Among the above, since excellent photocurability is exhibited, a n-heptyl group, a n-octyl group, and a n-nonyl group are preferable, and a n-octyl group is more preferable.

Although the alkenyl group is not particularly limited as long as the effects of the present embodiment are achieved, examples thereof include, for example, a vinyl group, a (meth)allyl group, an isopropenyl group, a 1-propenyl group, a 2-butenyl group, a 3-butenyl group, a 1,3-butanedienyl group, 2-methyl-2-propenyl, a 2-pentenyl group, a 3-pentenyl group, a 4-pentenyl group, a 2-hexenyl group, a 3-hexenyl group, a 4-hexenyl group, a 5-hexenyl group, a 2-heptenyl group, a 3-heptenyl group, a 4-heptenyl group, a 5-heptenyl group, a 6-heptenyl group, a 2-octenyl group, a 3-octenyl group, a 4-octenyl group, a 5-octenyl group, a 6-octenyl group, 7-octenyl, a 2-nonenyl group, a 3-nonenyl group, a 4-nonenyl group, a 5-nonenyl group, a 6-nonenyl group, a 7-nonenyl group, a 8-nonenyl group, a 2-decenyl group, a 3-decenyl group, a 4-decenyl group, a 5-decenyl group, a 6-decenyl group, a 7-decenyl group, a 8-decenyl group, a 9-decenyl group, a 2-dodecenyl group, a 3-dodecenyl group, a 4-dodecenyl group, a 5-dodecenyl group, a 6-dodecenyl group, a 7-dodecenyl group, a 8-dodecenyl group, a 9-dodecenyl group, a 10-dodecenyl group, a tetradecenyl group, a hexadecenyl group, an octadecenyl group, an eicosenyl group, an octadecadienyl group, a 9,12,15-octadecatrienyl group, a 9,11,13-octadecatrienyl group, and crotyl. Among the above, since excellent photocurability is exhibited, a 2-heptenyl group, a 2-octenyl group, and a 2-nonenyl group are preferable, and a 2-octenyl group is more preferable.

In the formula (5), Rb represents a linear or branched alkyl group having 1 to 16 carbon atoms, or a linear or branched alkenyl group having 2 to 16 carbon atoms. Rb is preferably a linear or branched alkyl group, and more preferably a linear alkyl group because excellent photocurability is exhibited.

The number of carbon atoms in the alkyl group is more preferably 4 to 12 since excellent photocurability is exhibited.

The number of carbon atoms in the alkenyl group is more preferably 4 to 12 since excellent photocurability is exhibited.

As specific examples of the alkyl group, the alkyl groups in $R^a$ described above can be referred to. Among them, since excellent photocurability is exhibited, a n-heptyl group, a n-octyl group, and a n-nonyl group are preferable, and a n-octyl group is more preferable.

As specific examples of the alkenyl group, the alkenyl groups in $R^a$ described above can be referred to. Among them, since excellent photocurability is exhibited, a 2-heptenyl group, a 2-octenyl group, and a 2-nonenyl group are preferable, and a 2-octenyl group is more preferable.

In the formula (5), the value of $n_a$ is 1 or more, preferably 2 to 16, and from the viewpoint of exhibiting excellent photocurability, more preferably 3 to 14.

In the formula (5), the value of $n_b$ is 1 or more, preferably 2 to 16, and from the viewpoint of exhibiting excellent photocurability, more preferably 3 to 14.

The values of $n_a$ and $n_b$ may be the same, or may be different.

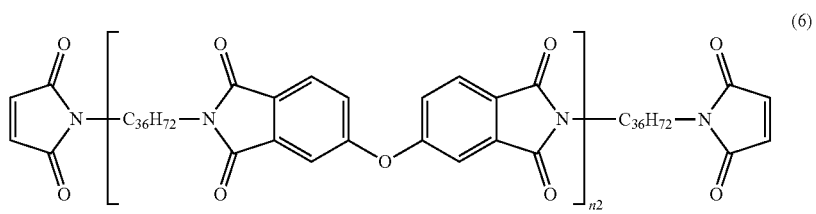

(6)

In the formula (6), $n_2$ (average) represents an integer of 1 or more, and from the viewpoint of exhibiting excellent photocurability, preferably an integer of 1 to 10 and more preferably an integer of 1 to 8.

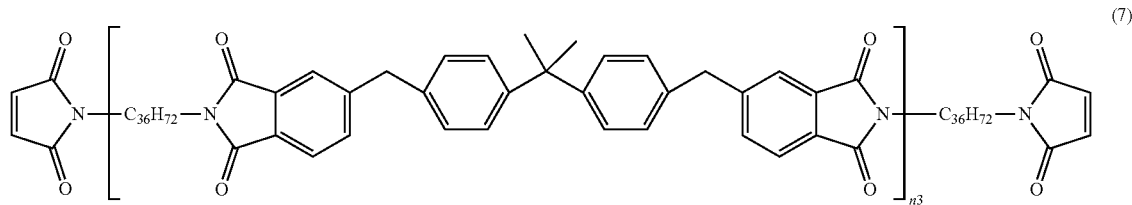

(7)

In the formula (7), $n_3$ represents an integer of 1 or more, and from the viewpoint of exhibiting excellent photocurability, preferably an integer of 1 to 10.

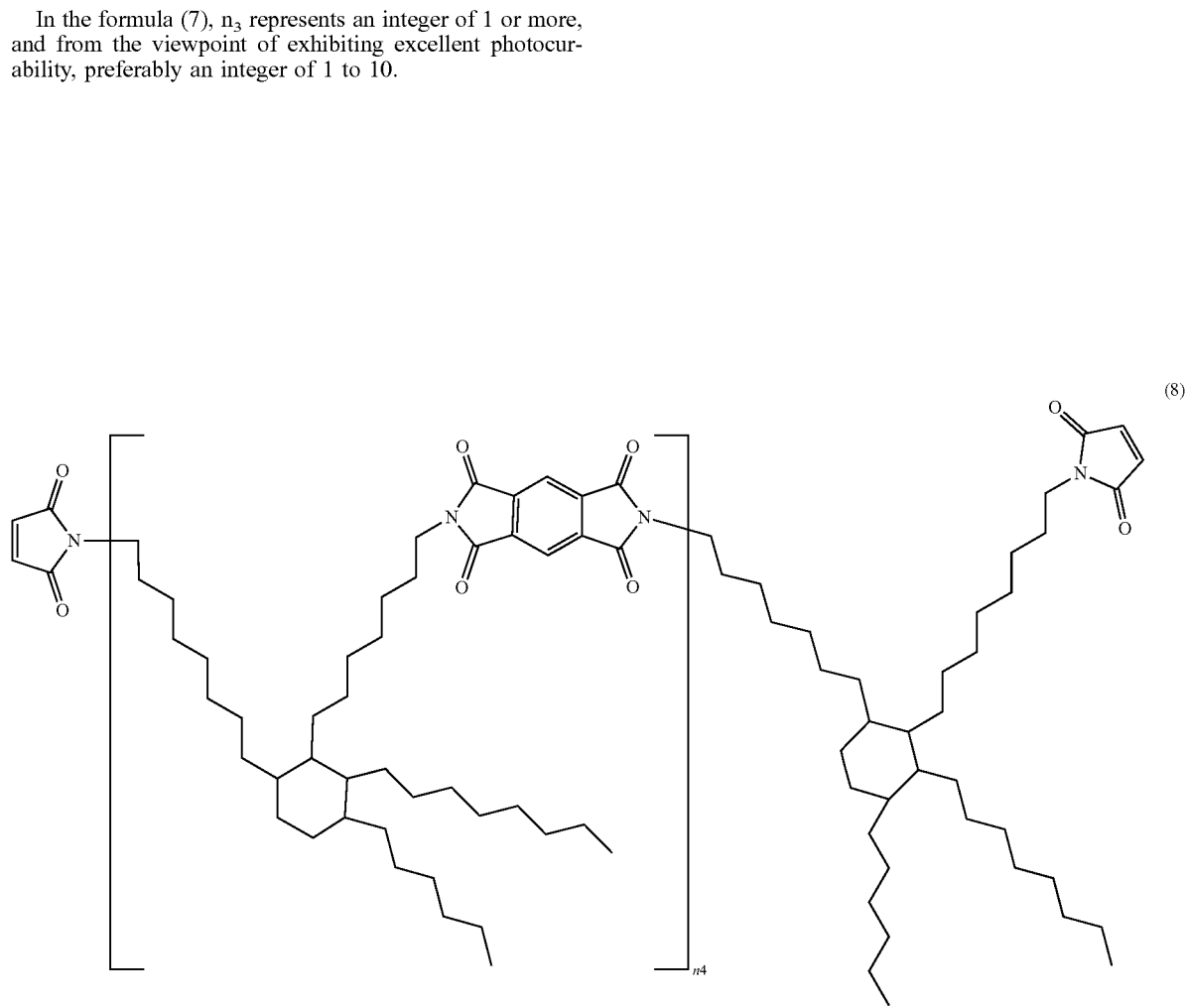

In the formula (8), $n_4$ represents an integer of 1 or more, and from the viewpoint of exhibiting excellent photocurability, preferably an integer of 1 to 10.

As the maleimide compound (A), commercial products can also be used.

Examples of the maleimide compound represented by the formula (3) include, for example, BMI-1000P (product name, $n_1$=13.6 (average) in the formula (3)) manufactured by K•I Chemical Industry Co., LTD., BMI-650P (product name, $n_1$=8.8 (average) in the formula (3)) manufactured by K•I Chemical Industry Co., LTD., BMI-250P (product name, $n_1$=3 to 8 (average) in the formula (3)) manufactured by K•I Chemical Industry Co., LTD., and CUA-4 (product name, $n_1$=1 in the formula (3)) manufactured by K•I Chemical Industry Co., LTD.

Examples of the maleimide compound represented by the formula (4) include, for example, BMI-6100 (product name, x=18 and y=18 in the formula (4)) manufactured by Designer Molecules Inc.

Examples of the maleimide compound represented by the formula (5) include, for example, BMI-689 (product name, the following formula (9), functional group equivalent: 346 g/eq.) manufactured by Designer Molecules Inc.

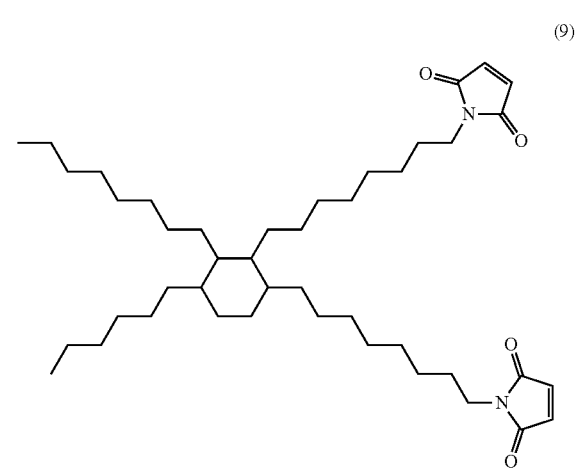 [SMILES: CCCCCCCCC1C(CCCCCC)CCC(CCCCCCCCN2C(=O)C=CC2=O)C1CCCCCCCCN1C(=O)C=CC1=O]

Examples of the maleimide compound represented by the formula (6) include, for example, BMI-1500 (product name, $n_2$=1.3 in the formula (6), functional group equivalent: 754 g/eq.) manufactured by Designer Molecules Inc.

Examples of the maleimide compound represented by the formula (7) include, for example, BMI-1700 (product name, a mixture wherein $n_3$ is 1 to 10 in the formula (7)) manufactured by Designer Molecules Inc.

Examples of the maleimide compound represented by the formula (8) include, for example, BMI-3000 (product name, $n_4$ is 3.1 (average value) in the formula (8)) manufactured by Designer Molecules Inc., BMI-5000 (product name, a mixture wherein $n_4$ is 1 to 10 in the formula (8)) manufactured by Designer Molecules Inc., and BMI-9000 (product name) manufactured by Designer Molecules Inc.

These maleimide compounds (A) may be used alone as one kind, or may be used in arbitrary combination of two or more kinds.

In the resin composition of the present embodiment, the compounding ratio between the maleimide compound (A) and the maleimide compound (B), which will be mentioned later, ((A):(B)) is not particularly limited, but from the viewpoint that it becomes possible to obtain a cured product mainly composed of the maleimide compounds and photocurability, heat resistance, thermal stability, and insulation reliability are improved, it is preferably 1 to 99:99 to 1, more preferably 5 to 95:95 to 5, and still more preferably 10 to 90:90 to 10 on a mass basis.

In the resin composition of the present embodiment, the total content of the maleimide compound (A) and the maleimide compound (B), which will be mentioned later, is not particularly limited, but from the viewpoint that it becomes possible to obtain a cured product mainly composed of the maleimide compounds and photocurability, heat resistance, thermal stability, and insulation reliability are improved, it is preferably 50 to 99.9 parts by mass, more preferably 70 to 99.8 parts by mass, and still more preferably 90 to 99.7 parts by mass based on 100 parts by mass of the total of the maleimide compound (A), the maleimide compound (B), and the photo initiator (C).

<Maleimide Compound (B)>

In the resin composition of the present embodiment, a maleimide compound (B) (also referred to as the "component (B)") according to the present embodiment is contained. The maleimide compound (B) according to the present embodiment is other than the maleimide compound (A), and has a maleimide functional group equivalent of less than 300 g/eq.

The maleimide compound (B) according to the present embodiment has a maleimide functional group equivalent of less than 300 g/eq., preferably 290 g/eq. or less, and from the standpoint of reactivity, more preferably 280 g/eq. or less. Although the lower limit of the maleimide functional group equivalent is not particularly limited, it is 110 g/eq. or more from the standpoint of reactivity. In the present embodiment, the maleimide functional group equivalent is calculated from the expression (1) described above, using the mass average molecular weight of the maleimide compound and the number of functional groups.

The maleimide compound (B) used in the present embodiment is not particularly limited as long as it is a compound other than the maleimide compound (A) and has one or more maleimide groups in the molecule. Specific examples thereof include, for example, N-phenylmaleimide, N-cyclohexylmaleimide, N-hydroxyphenylmaleimide, N-carboxyphenylmaleimide, N-(4-carboxy-3-hydroxyphenyl)maleimide, 6-maleimidohexanoic acid, 4-maleimidobutyric acid, bis(4-maleimidophenyl)methane, 2,2-bis(4-(4-maleimidophenoxy)-phenyl)propane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, o-phenylenebiscitraconimide, m-phenylenebiscitraconimide, p-phenylenebiscitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,2-bis(maleimido)ethane, 1,4-bis(maleimido)butane, 1,6-bis(maleimido)hexane, 1,6-bismaleimido-(2,2,4-trimethyl)hexane, 1,8-bismaleimido-3,6-dioxaoctane, 1,11-bismaleimido-3,6,9-trioxaundecane, 1,3-bis(maleimidomethyl)cyclohexane, 1,4-bis(maleimidomethyl)cyclohexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethanemaleimide, a maleimide compound represented by the following formula (10) such as polyphenylmethanemaleimide, a maleimide compound represented by the following formula (11), a maleimide compound represented by the following formula (12), and a maleimide compound represented by the following formula (13), as well as a prepolymer of these maleimide compounds, or a prepolymer of maleimide compounds and amine compounds. Among these maleimide compounds (B), a maleimide compound represented by the following formula (10) such as polyphenylmethanemaleimide, and 1,6-bismaleimido-(2,2,4-trimethyl)hexane are preferable from the standpoint that a cured product having more excellent heat resistance can be obtained.

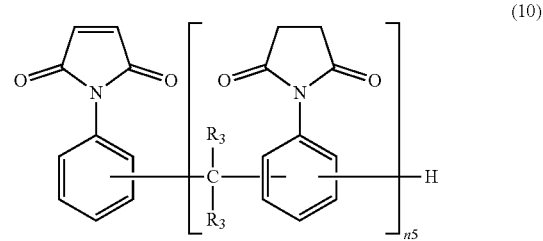

(10)

In the formula (10), a plurality of $R_3$ each independently represent a hydrogen atom or a methyl group. $n_5$ represents an integer of 1 or more, preferably represents an integer of 1 to 10, and more preferably represents an integer of 1 to 5.

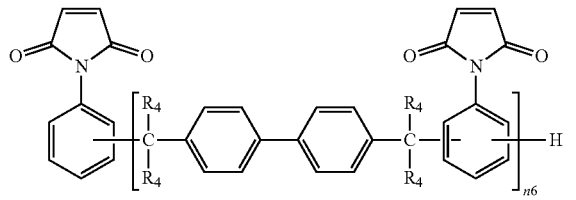

(11)

In the formula (11), a plurality of $R_4$ each independently represent a hydrogen atom or a methyl group. $n_6$ represents an integer of 1 or more and preferably represents an integer of 1 to 5.

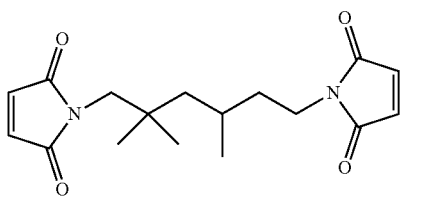

(12)

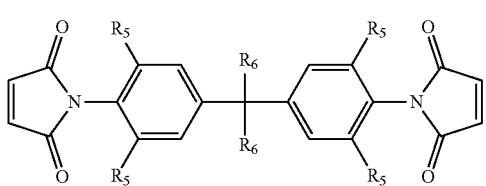

(13)

In the above formula (13), each $R_5$ independently represents a hydrogen atom, a methyl group, or an ethyl group, and each $R_6$ independently represents a hydrogen atom or a methyl group.

As the maleimide compound represented by the formula (10), commercial products can also be used, and examples thereof include, for example, BMI-2300 (product name, a mixture wherein all $R_3$ are hydrogen atoms and $n_5$ is 1 to 5 in the formula (10)) manufactured by Daiwa Kasei Industry Co., LTD. As the maleimide compound represented by the formula (11), commercial products can also be used, and examples thereof include, for example, MIR-3000 (product name, a mixture wherein all $R_4$ are hydrogen atoms and $n_6$ is 1 to 10 in the formula (11)) manufactured by Nippon Kayaku Co., Ltd. Examples of the maleimide compound represented by the following formula (12) include, for example, BMI-TMH manufactured by Daiwa Kasei Industry Co., LTD. (1,6-bismaleimido-(2,2,4-trimethyl)hexane). Examples of the maleimide compound represented by the following formula (13) include, for example, BMI-70 (product name, bis-(3-ethyl-5-methyl-4-maleimidophenyl)methane) manufactured by K•I Chemical Industry Co., LTD.

In the present embodiment, it is preferable to use the maleimide compound (B) represented by the formula (10) from the standpoint that a resin composition that is more excellent in heat resistance and thermal stability can be obtained. As for the maleimide compound (B) represented by the formula (10), when a chloroform solution containing this maleimide compound at 1% by mass is prepared and the light transmittance of this chloroform solution is measured using a ray of light with a wavelength of 405 nm (h-line), it has a transmittance of 0%, hardly transmits the light, and is not polymerized on its own. However, when it is photo-cured together with the maleimide compound (A) according to the present embodiment and the photo initiator (C), which will be mentioned later, better heat resistance and thermal stability are obtained. Although the reason for this is not certain, the present inventors estimate it as follows. That is, by mixing the maleimide compound (B) represented by the formula (10) with the maleimide compound (A), which has a high transmittance for a wavelength of 405 nm (h-line), the ray of light with a wavelength of 405 nm (h-line) is well transmitted in the resin composition. Therefore, it is estimated that the photo initiator (C) absorbs well the light with a wavelength of 405 nm (h-line) and generates radicals, resulting in the progression of polymerization of the maleimide compound (B) and the maleimide compound (A).

These maleimide compounds (B) may be used alone as one kind, or may be used in arbitrary combination of two or more kinds.

<Photo Initiator (C)>

In the resin composition of the present embodiment, a photo initiator (C) (also referred to as the "component (C)") according to the present embodiment is contained. The photo initiator (C) used in the present embodiment is not particularly limited as long as it has an absorbance of 0.1 or more at a wavelength of 405 nm (h-line), and those publicly known in the field generally used in photocurable resin compositions can be used. The photo initiator (C) may be used alone as one kind, or may be used in arbitrary combination of two or more kinds.

Here, having an absorbance of 0.1 or more at a wavelength of 405 nm (h-line) means that when a chloroform solution containing the component (C) at 1% by mass is prepared and the absorbance of this chloroform solution is measured using a ray of light with a wavelength of 405 nm (h-line), the absorbance is 0.1 or more. When such a photo initiator (C) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The absorbance at a wavelength of 405 nm (h-line) is more preferably 0.2 or more because a resin composition that is more excellent in photocurability can be obtained. Although the upper limit of the absorbance is not particularly limited, for example, it is 99.9 or less.

As the photo initiator (C), a compound represented by the following formula (1) is preferable.

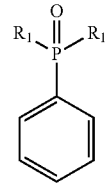

(1)

In the formula (1), a plurality of $R_1$ each independently represent a substituent represented by the following formula (2) or a phenyl group. It is preferable that one or more among a plurality of $R_1$ should be the substituents represented by the following formula (2).

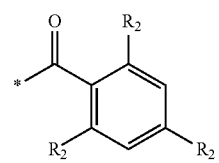

(2)

In the formula (2), -* shows a bonding site, and a plurality of $R_2$ each independently represent a hydrogen atom or a methyl group. It is preferable that one or more among a plurality of $R_2$ should be methyl groups, and it is more preferable that all should be methyl groups.

As for the compound represented by the formula (1), when a chloroform solution containing this compound at 1% by mass is prepared and the absorbance of this chloroform solution is measured using a ray of light with a wavelength of 405 nm (h-line), the absorbance is 0.1 or more, exhibiting very excellent absorption of the light with a wavelength of 405 nm (h-line). Therefore, this compound suitably generates radicals in response to the light with a wavelength of 405 nm (h-line).

It is preferable that the compound represented by the formula (1) should have an absorbance of 0.2 or more. Although the upper limit of the absorbance is not particularly limited, for example, it is 2.0 or less.

Although the compound represented by the formula (1) is not particularly limited, examples thereof include, for example, an acylphosphine oxide such as 2,4,6-trimethylbenzoyl-diphenyl-phosphine oxide, bis(2,4,6-trimethylbenzoyl)-phenylphosphine oxide, and ethoxyphenyl(2,4,6-trimethylbenzoyl)-phosphine oxide. These compounds may be used alone as one kind, or may be used in arbitrary combination of two or more kinds.

Acylphosphine oxides exhibit very excellent absorption of an active energy ray including a wavelength of 405 nm (h-line) and can suitably radical polymerize the maleimide compound having a transmittance of 1% or more at a wavelength of 405 nm (h-line). Therefore, according to the present embodiment, a resin composition, a resin sheet, a multilayer printed wiring board, and a semiconductor device can be suitably produced, wherein the resin composition has excellent photocurability, heat resistance, thermal stability, and insulation reliability, especially when used for multilayer printed wiring boards.

In the resin composition of the present embodiment, the content of the photo initiator (C) is not particularly limited, but from the viewpoint that the maleimide compounds are sufficiently cured by using an active energy ray including a wavelength of 405 nm (h-line), thereby improving the heat resistance, it is preferably 0.1 to 50 parts by mass, more preferably 0.2 to 30 parts by mass, and still more preferably 0.3 to 10 parts by mass based on 100 parts by mass of the total of the maleimide compound (A), the maleimide compound (B), and the photo initiator (C).

As the photo initiator (C), commercial products can also be used, and examples thereof include, for example, Omnirad (registered trademark) 819 (product name) manufactured by IGM Resins B.V., Omnirad (registered trademark) TPO G (product name) manufactured by IGM Resins B.V., and Omnirad (registered trademark) TPO L G (product name) manufactured by IGM Resins B.V.

<Filler (D)>

In the resin composition of the present embodiment, a filler (D) (also referred to as the component (D)) can also be used in combination in order to improve a variety of characteristics such as a coating property and heat resistance. The filler (D) used in the present embodiment is not particularly limited as long as it has an insulation property and does not inhibit transmissivity for a wavelength of 405 nm (h-line). Examples of the filler (D) include, for example, silica (for example, natural silica, fused silica, amorphous silica, hollow silica, and the like), an aluminum compound (for example, boehmite, aluminum hydroxide, alumina, and the like), a magnesium compound (for example, magnesium oxide, magnesium hydroxide, and the like), a calcium compound (for example, calcium carbonate and the like), a molybdenum compound (for example, molybdenum oxide, zinc molybdate, and the like), a barium compound (for example, barium sulfate, barium silicate, and the like), talc (for example, natural talc, calcined talc, and the like), mica, glass (for example, short fibrous glass, spherical glass, fine powder glass, E glass, T glass, D glass, and the like), silicone powder, a fluororesin-based filler, a urethane resin-based filler, a (meth)acrylic resin-based filler, a polyethylene-based filler, a styrene-butadiene rubber, and a silicone rubber.

Among the above, it is preferable that the filler (D) should be one or more selected from the group consisting of silica, boehmite, barium sulfate, silicone powder, a fluororesin-based filler, a urethane resin-based filler, a (meth)acrylic resin-based filler, a polyethylene-based filler, a styrene-butadiene rubber, and a silicone rubber.

These fillers (D) may be surface-treated with a silane coupling agent, which will be mentioned later, or the like.

From the viewpoint of improving the heat resistance of the cured product and also obtaining a good coating property, as the filler (D), silica is preferable and fused silica is more preferable. Specific examples of the silica include SFP-130MC (product name) manufactured by Denka Company Limited, and SC2050-MB (product name), SC1050-MLE (product name), YA010C-MFN (product name), and YA050C-MJA (product name) manufactured by Admatechs Company Limited.

These fillers (D) may be used alone as one kind, or may be used in arbitrary combination of two or more kinds.

The particle diameter of the filler is not particularly limited, but from the viewpoint of ultraviolet light transmissivity of the resin composition, it is normally 0.005 to 10 μm, and is preferably 0.01 to 1.0 μm.

Although the content of the filler (D) is not particularly limited, from the viewpoint of making the ultraviolet light transmissivity of the resin composition and the heat resistance of the cured product good, it is preferably 30 parts by mass or less, more preferably 20 parts by mass or less, and still more preferably 10 parts by mass or less based on 100 parts by mass of the resin solid content in the resin composition. When the filler (D) is contained, the lower limit value of its content is not particularly limited, but from the viewpoint of obtaining effects of improving a variety of characteristics such as a coating property and heat resistance, it is normally 1 part by mass based on 100 parts by mass of the resin solid content in the resin composition.

<Silane Coupling Agent and Wetting and Dispersing Agent>

In the resin composition of the present embodiment, a silane coupling agent and/or a wetting and dispersing agent can also be used in combination in order to improve the dispersibility of the filler, and the compatibility between the polymer and/or resin and the filler.

The silane coupling agent is not particularly limited as long as it is a silane coupling agent generally used for surface treatment of inorganic matters. Specific examples of the silane coupling agent include, for example, an aminosilane-based silane coupling agent such as γ-aminopropyltriethoxysilane and N-β-(aminoethyl)-γ-aminopropyltrimethoxysilane; an epoxysilane-based silane coupling agent such as γ-glycidoxypropyltrimethoxysilane; a (meth)acrylic silane-based silane coupling agent such as γ-(meth)acryloxypropyltrimethoxysilane; a cationic silane-based silane coupling agent such as N-β-(N-vinylbenzylaminoethyl)-γ-aminopropyltrimethoxysilane hydrochloride; and a phenylsilane-based silane coupling agent. These silane coupling agents may be used alone as one kind, or may be used in arbitrary combination of two or more kinds.

In the resin composition of the present embodiment, although the content of the silane coupling agent is not particularly limited, it is normally 0.1 to 10 parts by mass based on 100 parts by mass of the resin composition.

The wetting and dispersing agent is not particularly limited as long as it is a dispersion stabilizer used for a paint.

Specific examples of the wetting and dispersing agent include a wetting and dispersing agent such as DISPERBYK (registered trademark)-110 (product name), 111 (product name), 118 (product name), 180 (product name), and 161 (product name), BYK (registered trademark)-W996 (product name), W9010 (product name), and W903 (product name) manufactured by BYK Japan KK. These wetting and dispersing agents may be used alone as one kind, or may be used in arbitrary combination of two or more kinds.

In the resin composition of the present embodiment, although the content of the wetting and dispersing agent is not particularly limited, it is normally 0.1 to 10 parts by mass based on 100 parts by mass of the resin composition.

<Cyanate Compound, Phenolic Resin, Oxetane Resin, Benzoxazine Compound, Epoxy Resin, and Additional Compound>

In the present embodiment, as long as the resin composition of the present embodiment is light-sensitive and photo-cured when exposed with an active energy ray including a wavelength of 405 nm (h-line), a variety of types of compounds and resins, such as a cyanate compound, a phenolic resin, an oxetane resin, a benzoxazine compound, an epoxy resin, and an additional compound, can be used depending on required characteristics, such as flame retardancy, heat resistance, and thermal expansion characteristics of the cured product. For example, when heat resistance is required, mention may be made of a cyanate compound, a benzoxazine compound, and the like, and furthermore, a phenolic resin, an oxetane resin, and the like may also be used.

These compounds and resins may be used alone as one kind, or may be used in arbitrary combination of two or more kinds.

(Cyanate Compound)

The cyanate compound is not particularly limited as long as it is a resin having in the molecule an aromatic moiety substituted by at least one cyanate group (cyanate group).

For example, mention may be made of those represented by the formula (14).

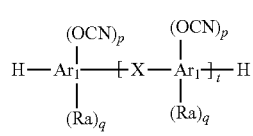

(14)

In the formula (14), $Ar_1$ represents a benzene ring, a naphthalene ring, or two benzene rings bonded to each other by a single bond. When there are a plurality of $Ar_1$, $Ar_1$ may be the same as or different from each other. Each Ra independently represents a hydrogen atom, an alkyl group having 1 to 6 carbon atoms, an alkenyl group having 2 to 6 carbon atoms, an aryl group having 6 to 12 carbon atoms, an alkoxyl group having 1 to 4 carbon atoms, or a group in which an alkyl group having 1 to 6 carbon atoms and an aryl group having 6 to 12 carbon atoms are bonded to each other. The aromatic ring for Ra may have a substituent, and any position can be selected for the substituents in $Ar_1$ and Ra. p represents the number of cyanate groups bonded to $Ar_1$ and is each independently an integer of 1 to 3. q represents the number of Ra bonded to $Ar_1$ and is 4−p when $Ar_1$ is a benzene ring, 6−p when $Ar_1$ is a naphthalene ring, and 8−p when $Ar_1$ is two benzene rings bonded to each other by a single bond. t represents the average number of repetitions and is an integer of 0 to 50, and the cyanate compound may be a mixture of compounds having different t. X represents any of a single bond, a divalent organic group having 1 to 50 carbon atoms (a hydrogen atom may be replaced by a heteroatom), a divalent organic group having 1 to 10 nitrogen atoms (for example, —N—R—N— (wherein R represents an organic group)), a carbonyl group (—CO—), a carboxy group (—C(=O)O—), a carbonyl dioxide group (—OC(=O)O—), a sulfonyl group (—SO$_2$—), a divalent sulfur atom, and a divalent oxygen atom, and X is each independently as defined above when there are a plurality of X.

The alkyl group for Ra in the formula (14) may have either a linear or branched chain structure or a cyclic structure (for example, a cycloalkyl group).

In addition, a hydrogen atom in the alkyl group and the aryl group for Ra in the formula (14) may be replaced by a halogen atom such as a fluorine atom or a chlorine atom; an alkoxyl group such as a methoxy group or a phenoxy group; a cyano group, or the like.

Specific examples of the alkyl group include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the alkenyl group include a vinyl group, a (meth)allyl group, an isopropenyl group, a 1-propenyl group, a 2-butenyl group, a 3-butenyl group, a 1,3-butanedienyl group, a 2-methyl-2-propenyl group, a 2-pentenyl group, and a 2-hexenyl group.

Specific examples of the aryl group include a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group.

Specific examples of the alkoxyl group include a methoxy group, an ethoxy group, a propoxy group, an isopropoxy group, a n-butoxy group, an isobutoxy group, and a tert-butoxy group.

Specific examples of the divalent organic group having 1 to 50 carbon atoms for X in the formula (14) include a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the above divalent organic group may be replaced by a halogen atom such as a fluorine atom or a chlorine atom; an alkoxyl group such as a methoxy group or a phenoxy group; a cyano group, or the like.

Examples of the divalent organic group having 1 to 10 nitrogen atoms for X in the formula (14) include an imino group and a polyimide group.

In addition, examples of the organic group of X in the formula (14) include one having a structure represented by the following formula (15) or the following formula (16).

(15)

In the formula (15), Ar$_e$ represents a benzenediyl group, a naphthalenediyl group, or a biphenyldiyl group, and may be the same as or different from each other when u is 2 or more. Rb, Rc, Rf, and Rg each independently represent a hydrogen atom, an alkyl group having 1 to 6 carbon atoms, an aryl group having 6 to 12 carbon atoms, a trifluoromethyl group, or an aryl group having at least one phenolic hydroxy group. Rd and Re are each independently selected from any one of a hydrogen atom, an alkyl group having 1 to 6 carbon atoms, an aryl group having 6 to 12 carbon atoms, an alkoxyl group having 1 to 4 carbon atoms, and a hydroxy group. u represents an integer of 0 to 5.

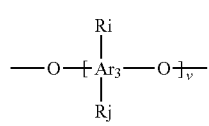
(16)

In the formula (16), Ar$_a$ represents a benzenediyl group, a naphthalenediyl group, or a biphenyldiyl group, and may be the same as or different from each other when v is 2 or more. Ri and Rj each independently represent a hydrogen atom, an alkyl group having 1 to 6 carbon atoms, an aryl group having 6 to 12 carbon atoms, a benzyl group, an alkoxyl group having 1 to 4 carbon atoms, a hydroxy group, a trifluoromethyl group, or an aryl group substituted by at least one cyanate group. v represents an integer of 0 to 5, and the cyanate compound may be a mixture of compounds having different v.

Furthermore, examples of X in the formula (14) include divalent groups represented by the following formulas.

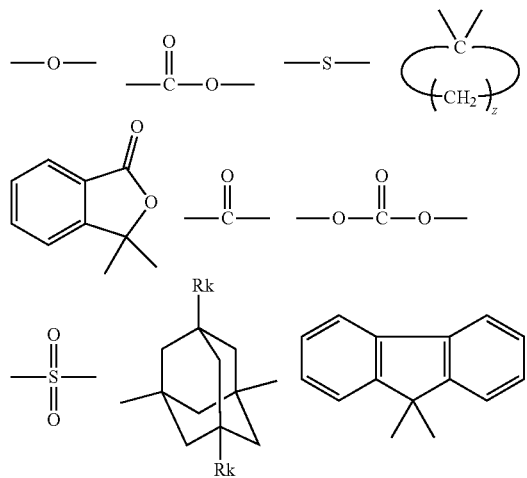

Here, in the above formula, z represents an integer of 4 to 7. Each Rk independently represents a hydrogen atom or an alkyl group having 1 to 6 carbon atoms.

Specific examples of Ar$_e$ in the formula (15) and Ar$_a$ in the formula (16) include a benzeneziyl group to which two carbon atoms shown in the formula (15) or two oxygen atoms shown in the formula (16) are bonded at positions 1 and 4 or positions 1 and 3, a biphenyldiyl group to which the above two carbon atoms or two oxygen atoms are bonded at positions 4 and 4', positions 2 and 4', positions 2 and 2', positions 2 and 3', positions 3 and 3', or positions 3 and 4', and a naphthalenediyl group to which the above two carbon atoms or two oxygen atoms are bonded at positions 2 and 6, positions 1 and 5, positions 1 and 6, positions 1 and 8, positions 1 and 3, positions 1 and 4, or positions 2 and 7.

The alkyl group and the aryl group for Rb, Rc, Rd, Re, Rf, and Rg in the formula (15) and Ri and Rj in the formula (16) have the same meanings as those in the above formula (14).

Specific examples of the cyanate-substituted aromatic compound represented by the above formula (14) include cyanatebenzene, 1-cyanate-2-, 1-cyanate-3-, or 1-cyanate-4-methylbenzene, 1-cyanate-2-, 1-cyanate-3-, or 1-cyanate-4-methoxybenzene, 1-cyanate-2,3-, 1-cyanate-2,4-, 1-cyanate-2,5-, 1-cyanate-2,6-, 1-cyanate-3,4-, or 1-cyanate-3,5-dimethylbenzene, cyanateethylbenzene, cyanatebutylbenzene, cyanateoctylbenzene, cyanatenonylbenzene, 2-(4-cyanaphenyl)-2-phenylpropane (a cyanate of 4-α-cumylphenol), 1-cyanate-4-cyclohexylbenzene, 1-cyanate-4-vinylbenzene, 1-cyanate-2- or 1-cyanate-3-chlorobenzene, 1-cyanate-2,6-dichlorobenzene, 1-cyanate-2-methyl-3-chlorobenzene, cyanatenitrobenzene, 1-cyanate-4-nitro-2-ethylbenzene, 1-cyanate-2-methoxy-4-allylbenzene (a cyanate of eugenol), methyl(4-cyanatephenyl)sulfide, 1-cyanate-3-trifluoromethylbenzene, 4-cyanatebiphenyl, 1-cyanate-2- or 1-cyanate-4-acetylbenzene, 4-cyanatebenzaldehyde, methyl 4-cyanatebenzoate ester, phenyl 4-cyanatebenzoate ester, 1-cyanate-4-acetaminobenzene, 4-cyanatebenzophenone, 1-cyanate-2,6-di-tert-butylbenzene, 1,2-dicyanatebenzene, 1,3-dicyanatebenzene, 1,4-dicyanatebenzene, 1,4-dicyanate-2-tert-butylbenzene, 1,4-dicyanate-2,4-dimethylbenzene, 1,4-dicyanate-2,3,4-dimethylbenzene, 1,3-dicyanate-2,4,6-trimethylbenzene, 1,3-dicyanate-5-methylbenzene, 1-cyanate- or 2-cyanatenaphthalene, 1-cyanate4-methoxynaphthalene, 2-cyanate-6-methoxynaphthalene, 2-cyanate-7-methoxynaphthalene, 2,2'-dicyanate-1,1'-binaphthyl, 1,3-, 1,4-, 1,5-, 1,6-, 1,7-, 2,3-, 2,6-, or 2,7-dicyanatenaphthalene, 2,2'- or 4,4'-dicyanatebiphenyl, 4,4'-dicyanateoctafluorobiphenyl, 2,4'- or 4,4'-dicyanatediphenylmethane, bis(4-cyanate-3,5-dimethylphenyl)methane, 1,1-bis(4-cyanatephenyl)ethane, 1,1-bis(4-cyanatephenyl)propane, 2,2-bis(4-cyanatephenyl)propane, 2,2-bis(4-cyanate-3-methylphenyl)propane, 2,2-bis(2-cyanate-5-biphenylyl)propane, 2,2-bis(4-cyanatephenyl)hexafluoropropane, 2,2-bis(4-cyanate-3,5-dimethylphenyl)propane, 1,1-bis(4-cyanatephenyl)butane, 1,1-bis(4-cyanatephenyl)isobutane, 1,1-bis(4-cyanatephenyl)pentane, 1,1-bis(4-cyanatephenyl)-3-methylbutane, 1,1-bis(4-cyanatephenyl)-2-methylbutane, 1,1-bis(4-cyanatephenyl)-2,2-dimethylpropane, 2,2-bis(4-cyanatephenyl)butane, 2,2-bis(4-cyanatephenyl)pentane, 2,2-bis(4-cyanatephenyl)hexane, 2,2-bis(4-cyanatephenyl)-3-methylbutane, 2,2-bis(4-cyanatephenyl)-4-methylpentane, 2,2-bis(4-cyanatephenyl)-3,3-dimethylbutane, 3,3-bis(4-cyanatephenyl)hexane, 3,3-bis(4-cyanatephenyl)heptane, 3,3-bis(4-cyanatephenyl)octane, 3,3-bis(4-cyanatephenyl)-2-methylpentane, 3,3-bis(4-cyanatephenyl)-2-methylhexane, 3,3-bis(4-cyanatephenyl)-2,2-dimethylpentane, 4,4-bis(4-cyanatephenyl)-3-methylheptane, 3,3-bis(4-cyanatephenyl)-2-methylheptane, 3,3-bis(4-cyanatephenyl)-2,2-dimethylhexane, 3,3-bis(4-cyanatephenyl)-2,4-dimethylhexane, 3,3-bis(4-cyanatephenyl)-2,2,4-trimethylpentane, 2,2-bis(4-cyanatephenyl)-1,1,1,3,3,3-hexafluoropropane, bis(4-cyanatephenyl)phenylmethane, 1,1-bis(4-cyanatephenyl)-1-phenylethane, bis(4-cyanatephenyl)biphenylmethane, 1,1-bis(4-cyanatephenyl)cyclopentane, 1,1-bis(4-cyanatephenyl)cyclohexane, 2,2-bis(4-cyanate-3-isopropylphenyl)propane, 1,1-bis(3-cyclohexyl-4-cyanatephenyl)cyclohexane, bis(4-cyanatephenyl) diphenylmethane, bis(4-cyanatephenyl)-2,2- dichloroethylene, 1,3-bis[2-(4-cyanatephenyl)-2-propyl]benzene, 1,4-bis[2-(4-cyanatephenyl)-2-propyl]benzene, 1,1-bis(4-cyanatephenyl)-3,3,5-trimethylcyclohexane, 4-[bis(4-cyanatephenyl)methyl]biphenyl, 4,4-dicyanatebenzophenone, 1,3-bis(4-cyanatephenyl)-2-propen-1-one, bis(4-cyanatephenyl) ether, bis(4-cyanatephenyl) sulfide, bis(4-cyanatephenyl) sulfone, 4-cyanatebenzoic acid-4-cyanatephenyl ester (4-cyanatephenyl-4-cyanatebenzoate), bis-(4-cyanatephenyl) carbonate, 1,3-bis(4-cyanatephenyl)adamantane, 1,3-bis(4-cyanatephenyl)-5,7-dimethyladamantane, 3,3-bis(4-cyanatephenyl)isobenzofuran-1(3H)-one (a cyanate of phenolphthalein), 3,3-bis(4-cyanate-3-methylphenyl)isobenzofuran-1(3H)-one (a cyanate of o-cresolphthalein), 9,9'-bis(4-cyanatephenyl)fluorene, 9,9-bis(4-cyanate-3-methylphenyl)fluorene, 9,9-bis(2-cyanate-5-biphenylyl)fluorene, tris(4-cyanatephenyl)methane, 1,1,1-tris(4-cyanatephenyl)ethane, 1,1,3-tris(4-cyanatephenyl)propane, α,α,α'-tris(4-cyanatephenyl)-1-ethyl-4-isopropylbenzene, 1,1,2,2-tetrakis(4-cyanatephenyl)ethane, tetrakis(4-cyanatephenyl)methane, 2,4,6-tris(N-methyl-4-cyanateanilino)-1,3,5-triazine, 2,4-bis(N-methyl-4-cyanateanilino)-6-(N-methylanilino)-1,3,5-triazine, bis(N-4-cyanate-2-methylphenyl)-4,4'-oxydiphthalimide, bis(N-3-cyanate-4-methylphenyl)-4,4'-oxydiphthalimide, bis(N-4-cyanatephenyl)-4,4'-oxydiphthalimide, bis(N-4-cyanate-2-methylphenyl)-4,4'-(hexafluoroisopropylidene)diphthalimide, tris(3,5-dimethyl-4-cyanatebenzyl)isocyanurate, 2-phenyl-3,3-bis(4-cyanatephenyl)phthalimidine, 2-(4-methylphenyl)-3,3-bis(4-cyanatephenyl)phthalimidine, 2-phenyl-3,3-bis(4-cyanate-3-methylphenyl)phthalimidine, 1-methyl-3,3-bis(4-cyanatephenyl)indolin-2-one, and 2-phenyl-3,3-bis(4-cyanatephenyl)indolin-2-one.

These cyanate compounds may be used alone as one kind or may be used in arbitrary combination of two or more kinds.

In addition, other specific examples of the cyanate compound represented by the above formula (14) include those obtained by cyanation of a phenolic resin such as a phenol novolac resin and a cresol novolac resin (those obtained by reacting phenol, an alkyl-substituted phenol or a halogen-substituted phenol with a formaldehyde compound such as formalin or paraformaldehyde in an acidic solution, using a publicly known method), a trisphenol novolac resin (those obtained by reacting hydroxybenzaldehyde with phenol in the presence of an acidic catalyst), a fluorene novolac resin (those obtained by reacting a fluorenone compound with a 9,9-bis(hydroxyaryl)fluorene in the presence of an acidic catalyst), a phenol aralkyl resin, a cresol aralkyl resin, a naphthol aralkyl resin, and a biphenyl aralkyl resin (those obtained by reacting a bishalogenomethyl compound as represented by $Ar_4$—$(CH_2Y)_2$ (wherein $Ar_4$ represents a phenyl group and Y represents a halogen atom. The same applies in this paragraph.) with a phenolic compound with an acidic catalyst or with no catalyst, those obtained by reacting a bis(alkoxymethyl) compound as represented by $Ar_4$—$(CH_2OR)_2$ (wherein R represents an alkyl group) with a phenolic compound in the presence of an acidic catalyst, or those obtained by reacting a bis(hydroxymethyl) compound as represented by $Ar_4$—$(CH_2OH)_2$ with a phenolic compound in the presence of an acidic catalyst, or those obtained by polycondensing an aromatic aldehyde compound, an aralkyl compound, and a phenolic compound, using a publicly known method), a phenol-modified xylene formaldehyde resin (those obtained by reacting a xylene formaldehyde resin with a phenolic compound in the presence of an acidic catalyst, using a publicly known method), a modified naphthalene formaldehyde resin (those obtained by reacting a naphthalene formaldehyde resin with a hydroxy-substituted aromatic compound in the presence of an acidic catalyst, using a publicly known method), a phenol-modified dicyclopentadiene resin, and a phenolic resin having a polynaphthylene ether structure (those obtained by subjecting a polyvalent hydroxynaphthalene compound having two or more phenolic hydroxy groups in one molecule to dehydration condensation in the presence of a basic catalyst, using a publicly known method) by a method similar to the above, and a prepolymer thereof. There is no particular limitation on them. These cyanate compounds may be used alone as one kind, or may be used in arbitrary combination of two or more kinds.

The method for producing these cyanate compounds is not particularly limited, and a publicly known method can be used. Examples of such a production method include acquisition or synthesis of a hydroxy group containing compound having a desired skeleton and cyanation of that compound by modifying the hydroxy group by a publicly known method. Examples of the approach for the cyanation of hydroxy groups include, for example, the approach described in Ian Hamerton, "Chemistry and Technology of Cyanate Ester Resins," Blackie Academic & Professional.

The resin cured product using these cyanate compounds has characteristics excellent in glass transition temperature, low thermal expansion properties, plating adhesiveness, and the like.

Although the content of the cyanate compound is not particularly limited, it is preferably 0.01 to 40 parts by mass based on 100 parts by mass of the resin solid content in the resin composition.

(Phenolic Resin)

As the phenolic resin, those publicly known in general can be used as long as they are phenolic resins having two or more hydroxyl groups in one molecule. Examples thereof include, but are not particularly limited to, for example, a bisphenol A-based phenolic resin, a bisphenol E-based phenolic resin, a bisphenol F-based phenolic resin, a bisphenol S-based phenolic resin, a phenol novolac resin, a bisphenol A novolac-based phenolic resin, a glycidyl ester-based phenolic resin, an aralkyl novolac-based phenolic resin, a biphenyl aralkyl-based phenolic resin, a cresol novolac-based phenolic resin, a polyfunctional phenolic resin, a naphthol resin, a naphthol novolac resin, a polyfunctional naphthol resin, an anthracene-based phenolic resin, a naphthalene skeleton modified novolac-based phenolic resin, a phenol aralkyl-based phenolic resin, a naphthol aralkyl-based phenolic resin, a dicyclopentadiene-based phenolic resin, a biphenyl-based phenolic resin, an alicyclic phenolic resin, a polyol-based phenolic resin, a phosphorus containing phenolic resin, a polymerizable unsaturated hydrocarbon group containing phenolic resin, and a hydroxyl group containing silicone resin. These phenolic resins may be used alone as one kind, or may be used in arbitrary combination of two or more kinds.

The content of the phenolic resin is not particularly limited, and it is preferably 0.01 to 40 parts by mass based on 100 parts by mass of the resin solid content in the resin composition.

(Oxetane Resin)

As the oxetane resin, those publicly known in general can be used. Examples thereof include, but are not particularly limited to, for example, oxetane, an alkyloxetane such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluoxetane, 2-chloromethyloxetane, 3,3-bis(chloromethyl)oxetane, biphenyl-based oxetane, OXT-101 (manufactured by Toagosei Co., Ltd., product name), and OXT-121 (manufactured by Toagosei Co., Ltd., product name). One of these oxetane resins can be used, or two or more of these oxetane resins can be appropriately mixed and used.

The content of the oxetane resin is not particularly limited, and it is preferably 0.01 to 40 parts by mass based on 100 parts by mass of the resin solid content in the resin composition.

(Benzoxazine Compound)

As the benzoxazine compound, those publicly known in general can be used as long as they are compounds having two or more dihydrobenzoxazine rings in one molecule. Examples thereof include, but are not limited to, for example, a bisphenol A-based benzoxazine BA-BXZ (manufactured by Konishi Chemical Ind. Co., Ltd., product name), a bisphenol F-based benzoxazine BF-BXZ (manufactured by Konishi Chemical Ind. Co., Ltd., product name), a bisphenol S-based benzoxazine BS-BXZ (manufactured by Konishi Chemical Ind. Co., Ltd., product name), and a phenolphthalein-based benzoxazine. These benzoxazine compounds may be used alone as one kind, or may be used in arbitrary combination of two or more kinds.

The content of the benzoxazine compound is not particularly limited, and it is preferably 0.01 to 40 parts by mass based on 100 parts by mass of the resin solid content in the resin composition.

(Epoxy Resin)

There is no particular limitation on the epoxy resin, and those publicly known in general can be used. Examples thereof include, for example, a bisphenol A-based epoxy resin, a bisphenol E-based epoxy resin, a bisphenol F-based epoxy resin, a bisphenol S-based epoxy resin, a bisphenol A novolac-based epoxy resin, a biphenyl-based epoxy resin, a phenol novolac-based epoxy resin, a cresol novolac-based epoxy resin, a xylene novolac-based epoxy resin, a polyfunctional phenol-based epoxy resin, a naphthalene-based epoxy resin, a naphthalene skeleton modified novolac-based epoxy resin, a naphthylene ether-based epoxy resin, a phenol aralkyl-based epoxy resin, an anthracene-based epoxy resin, a trifunctional phenol-based epoxy resin, a tetrafunctional phenol-based epoxy resin, triglycidyl isocyanurate, a glycidyl ester-based epoxy resin, an alicyclic epoxy resin, a dicyclopentadiene novolac-based epoxy resin, a biphenyl novolac-based epoxy resin, a phenol aralkyl novolac-based epoxy resin, a naphthol aralkyl novolac-based epoxy resin, an aralkyl novolac-based epoxy resin, a naphthol aralkyl-based epoxy resin, a dicyclopentadiene-based epoxy resin, a polyol-based epoxy resin, a phosphorus containing epoxy resin, a glycidyl amine, a compound obtained by epoxidizing a double bond of butadiene and the like, a compound obtained by the reaction between a hydroxyl group containing silicone resin and epichlorohydrin, and a halide thereof.

As the epoxy resin, commercial products can be used, and examples thereof include, for example, a naphthalene-based epoxy resin represented by the following formula (17) (HP-4710 (product name) manufactured by DIC CORPORATION) and an epoxy resin represented by the following formula (18) (NC-3000FH (product name) manufactured by Nippon Kayaku Co., Ltd., $n_7$ is about 4 in the formula (18)).

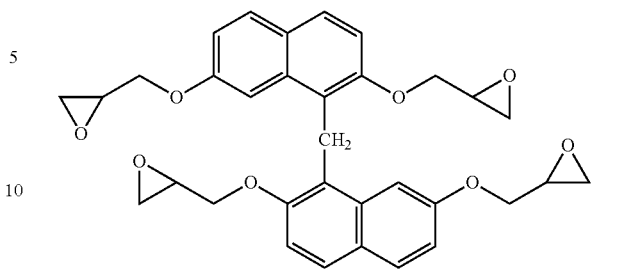

(17)

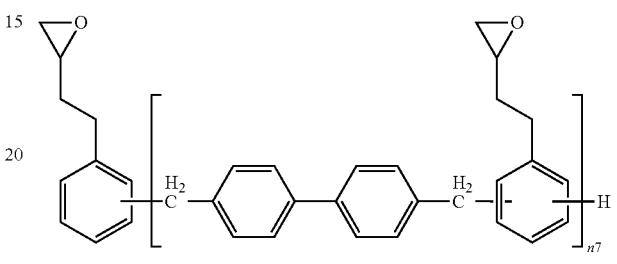

(18)

These epoxy resins may be used alone as one kind, or may be used in arbitrary combination of two or more kinds.

Although the content of the epoxy resin is not particularly limited, it is preferably 0.01 to 40 parts by mass based on 100 parts by mass of the resin solid content in the resin composition.

<Additional Compound>

Examples of the additional compound include a vinyl ether such as ethyl vinyl ether, propyl vinyl ether, hydroxyethyl vinyl ether, and ethylene glycol divinyl ether; a styrene such as styrene, methylstyrene, ethylstyrene, and divinylbenzene; triallyl isocyanurate, trimethallyl isocyanurate, and bisallylnadic imide. These additional compounds may be used alone as one kind, or may be used in arbitrary combination of two or more kinds.

Although the content of the additional compound is not particularly limited, it is preferably 0.01 to 40 parts by mass based on 100 parts by mass of the resin solid content in the resin composition.

<Curing Accelerator>

The resin composition of the present embodiment may contain a curing accelerator if required in order to appropriately adjust the cure rate. The curing accelerator is not particularly limited, and those generally used as a curing accelerator for cyanate compounds or the like can be used. Examples of the curing accelerator include, for example, an organometallic salt such as zinc octylate, zinc naphthenate, cobalt naphthenate, copper naphthenate, iron acetylacetonate, nickel octylate, and manganese octylate; a phenolic compound such as phenol, xylenol, cresol, resorcin, catechol, octyl phenol, and nonyl phenol; an alcohol such as 1-butanol and 2-ethylhexanol; an imidazole such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole, and a derivative of these imidazoles such as an adduct with a carboxylic acid or anhydride thereof; an amine such as dicyandiamide, benzyl dimethylamine, and 4-methyl-N,N-dimethylbenzylamine; a phosphorus compound such as a phosphine-based compound, a phosphonium salt-based compound, and diphosphine-based compound; an epoxy-imidazole adduct-based compound; a peroxide such as benzoyl peroxide, p-chlorobenzoyl peroxide, di-t-butyl peroxide, diisopropyl peroxycarbonate, and di-2-ethylhexyl peroxycarbonate; and an azo compound such as 2,2'-azobisisobutyronitrile. These curing accelerators may be used alone as one kind, or may be used in arbitrary combination of two or more kinds.

In the resin composition of the present embodiment, although the content of the curing accelerator is not particularly limited, it is normally 0.1 to 20 parts by mass based on 100 parts by mass of the resin composition.

<Organic Solvent>

The resin composition of the present embodiment may contain a solvent if required. For example, when an organic solvent is used, the viscosity can be adjusted during the preparation of the resin composition. The type of the solvent is not particularly limited as long as it is capable of dissolving a part of or all of the resin in the resin composition. Specific examples thereof include, but are not limited to, a ketone such as acetone, methyl ethyl ketone, and methyl cellosolve; an aromatic hydrocarbon such as toluene and xylene; an amide such as dimethylformamide; and propylene glycol monomethyl ether and acetate thereof.

These organic solvents may be used alone as one kind, or may be used in arbitrary combination of two or more kinds.

<Additional Component>

In the resin composition of the present embodiment, a variety of polymer compounds such as thermosetting resins, thermoplastic resins and oligomers thereof, and elastomers, which have not been mentioned before; flame retardant compounds, which have not been mentioned before; additive agents and the like can also be used in combination to the extent that the characteristics of the present embodiment are not impaired. These components are not particularly limited as long as they are generally used. Examples of the flame retardant compound include, for example, a nitrogen containing compound such as melamine and benzoguanamine, an oxazine ring containing compound, and a phosphorus compound such as a phosphate compound, an aromatic fused phosphate ester, and a halogen containing fused phosphate ester. Examples of the additive agent include, for example, an ultraviolet absorbing agent, an antioxidant, a fluorescent brightening agent, a photosensitizer, a dye, a pigment, a thickening agent, a lubricant, a defoaming agent, a surface conditioner, a brightening agent, and a polymerization inhibitor. These components may be used alone as one kind, or may be used in arbitrary combination of two or more kinds.

In the resin composition of the present embodiment, although the content of each additional component is not particularly limited, it is normally 0.1 to 10 parts by mass based on 100 parts by mass of the resin composition.

<Method for Producing Resin Composition>

The resin composition of the present embodiment is prepared by appropriately mixing the maleimide compound (A), maleimide compound (B) and photo initiator (C) according to the present embodiment, and if required, the filler (D), the additional resin, the additional compound, the curing accelerator, the additive agent, and the like. In addition, the organic solvent may be mixed in if required. The resin composition of the present embodiment can be suitably used as a varnish upon fabricating a resin sheet of the present embodiment, which will be mentioned later.

The method for producing the resin composition of the present embodiment is not particularly limited, and examples thereof include, for example, a method in which each of the components described above is sequentially compounded in a solvent and stirred sufficiently.

Upon producing the resin composition, publicly known treatment (stirring, mixing, and kneading treatment and the like) for uniformly dissolving or dispersing each component can be carried out, if required. Specifically, by using a stirring tank equipped with a stirrer having an appropriate stirring capacity to carry out the stirring and dispersion treatment, the dispersibility of the filler in the resin composition can be improved. The stirring, mixing, and kneading treatment described above can be appropriately carried out by using a publicly known apparatus such as a stirring apparatus intended for dispersion such as an ultrasonic homogenizer; an apparatus intended for mixing such as a three roll mill, a ball mill, a bead mill, or a sand mill; or a revolution or rotation mixing apparatus. In addition, upon preparing the resin composition of the present embodiment, an organic solvent can be used if required. The type of the organic solvent is not particularly limited as long as it is capable of dissolving the resin in the resin composition, and specific examples thereof are as described above.

<Application>

The resin composition of the present embodiment can be used in applications where an insulating resin composition is required, and the applications are not particularly limited. For example, the resin composition of the present embodiment can be used for applications including a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, and a component embedding resin. Among the above, the resin composition of the present embodiment can be suitably used for an insulating layer of a multilayer printed wiring board and for a solder resist because it is excellent in photocurability, heat resistance, thermal stability, and insulation reliability.

<Resin Sheet>

A resin sheet of the present embodiment is a resin sheet with a support containing: a support; and a resin layer disposed on one surface or both surfaces of the support, wherein the resin layer contains the resin composition of the present embodiment. The resin sheet can be produced by applying the resin composition onto the support and drying it. The resin layer in the resin sheet of the present embodiment has excellent heat resistance, thermal stability, and insulation reliability.

As the support, those publicly known can be used and there is no particular limitation thereon, but it is preferably a resin film. Examples of the resin film include, for example, a resin film such as polyimide film, polyamide film, polyester film, polyethylene terephthalate (PET) film, polybutylene terephthalate (PBT) film, polypropylene (PP) film, polyethylene (PE) film, polyethylene naphthalate film, polyvinyl alcohol film, and triacetyl acetate film. Among the above, PET film is preferable.

As the resin film, those having a release agent coated on the surface thereof can be suitably used in order to facilitate release from the resin layer. The thickness of the resin film is preferably in the range of 5 to 100 μm and more preferably in the range of 10 to 50 μm. When the thickness is less than 5 μm, the support tends to be easily torn upon releasing the support, and when the thickness is greater than 100 μm, the resolution upon being exposed through the support tends to be reduced.

In addition, in order to reduce light scattering during exposure, it is preferable that the resin film should have excellent transparency.

Furthermore, in the resin sheet in the present embodiment, the resin layer thereof may be protected with a protective film.

By protecting the resin layer side with a protective film, adhesion of dust and the like to the surface of the resin layer and scratches can be prevented. As the protective film, a film composed of a material similar to the resin film described above can be used. Although the thickness of the protective film is not particularly limited, it is preferably in the range of 1 to 50 μm and more preferably in the range of 5 to 40 μm. If the thickness is less than 1 μm, the handleability of the protective film tends to be reduced, and if the thickness is greater than 50 μm, the inexpensiveness tends to be poor. Note that it is preferable for the protective film to have a smaller adhesive force between the resin layer and the protective film than the adhesive force between the resin layer and the support.

Although the method for producing the resin sheet of the present embodiment is not particularly limited, examples thereof include, for example, a method in which the resin composition of the present embodiment is applied to a support such as PET film and the organic solvent is removed by drying to produce the resin sheet.

The application method can be carried out by a publicly known method using, for example, a roll coater, a comma coater, a gravure coater, a die coater, a bar coater, a lip coater, a knife coater, a squeeze coater, or the like. The drying described above can be carried out by, for example, a method of heating in a dryer at 60 to 200° C. for 1 to 60 minutes.

The amount of organic solvent remaining in the resin layer is preferably less than 5% by mass based on the total mass of the resin layer from the viewpoint of preventing diffusion of the organic solvent in the subsequent steps. It is preferable that the thickness of the resin layer should be 1 to 50 μm from the viewpoint of improving handleability.

The resin sheet of the present embodiment can be used as an insulating layer of a multilayer printed wiring board.

<Multilayer Printed Wiring Board>

A multilayer printed wiring board of the present embodiment contains an insulating layer containing the resin composition of the present embodiment. The insulating layer can also be obtained by, for example, stacking one or more of the resin sheets described above and curing them. Specifically, it can be produced by the following method.

(Lamination Step)

In a lamination step, the resin layer side of the resin sheet of the present embodiment is laminated to one surface or both surfaces of a circuit substrate using a vacuum laminator. Examples of the circuit substrate include, for example, a glass epoxy substrate, a metal substrate, a ceramic substrate, a silicon substrate, a semiconductor sealing resin substrate, a polyester substrate, a polyimide substrate, a BT resin substrate, and a thermosetting polyphenylene ether substrate. Note that, in the present embodiment, a circuit substrate refers to a substrate in which a patterned conductor layer (circuit) is formed on one surface or both surfaces of a substrate as described above. Also, in the present embodiment, in a multilayer printed wiring board formed by alternately stacking a conductor layer and an insulating layer, a substrate in which one surface or both surfaces of the outermost layer of the printed wiring board are patterned conductor layers (circuits) is also included in the circuit substrate. The surface of the conductor layer may be subjected to blackening treatment and/or roughening treatment by copper etching or the like in advance. In the lamination step, when the resin sheet has a protective film, the protective film is peeled off and removed. Then, the resin sheet and the circuit substrate are preheated if required, and while pressurizing and heating the resin layer of the resin sheet, it is crimped to the circuit substrate. In the present embodiment, a method of laminating the resin layer of the resin sheet to the circuit substrate under reduced pressure using a vacuum lamination method is suitably used.

Although the conditions of the lamination step are not particularly limited, for example, it is preferable to perform the lamination under reduced pressure with a crimping temperature (lamination temperature) of 50 to 140° C., crimping pressure of 1 to 15 kgf/cm$^2$, crimping time of 5 to 300 seconds, and air pressure of 20 mmHg or less. Also, the lamination step may be in a batch type or in a continuous type using a roll. The vacuum lamination method can be carried out using a commercially available vacuum laminator. Examples of the commercially available vacuum laminator include, for example, a two-stage build-up laminator manufactured by Nikko-Materials Co., Ltd.

(Exposure Step)

In the exposure step, after providing the resin layer on the circuit substrate by the lamination step, a predetermined portion of the resin layer is irradiated with an active energy ray including a wavelength of 405 nm (h-line) as a light source to cure the resin layer in the irradiated part. The irradiation may be performed through a mask pattern or may be performed by using the direct imaging method in which the irradiation is directly applied. When the direct imaging method is used, a printed wiring board having a highly dense and highly detailed wiring formation (pattern) can be produced. Examples of the active energy ray include, for example, ultraviolet rays, visible rays of light, electron beam, and X-rays. Although the wavelength of the active energy ray is not particularly limited, it is, for example, in the range of 200 to 600 nm.

The irradiation amount of the active energy ray including a wavelength of 405 nm (h-line) is approximately 10 to 10,000 mJ/cm$^2$. There are two exposure methods for passing through the mask pattern: the contact exposure method, in which the mask pattern is adhered to the multilayer printed wiring board, and the non-contact exposure method, in which parallel light rays are used to perform the exposure without adhering the mask pattern to the multilayer printed wiring board, but either method may be used. Also, when a support is present on the resin layer, it may be exposed from the top of the support, or it may be exposed after the support is removed.

(Postbaking Step)

In the present embodiment, a heat treatment (postbaking) step is carried out after the exposure step, thereby forming an insulating layer (cured product). Examples of the postbaking step include an ultraviolet irradiation step with a high pressure mercury lamp and a heating step using a clean oven, and these steps may be used in combination as well. When irradiating with ultraviolet ray, the irradiation amount thereof can be adjusted if required, and for example, the irradiation can be carried out at an irradiation amount of approximately 0.05 to 10 J/cm$^2$. Also, the conditions of heating can be appropriately selected if required, but they are preferably selected from the range of 20 to 180 minutes at 150 to 220° C., and more preferably from the range of 30 to 150 minutes at 160 to 200° C.

(Conductor Layer Formation Step)

After forming the insulating layer (cured product), a conductor layer is formed on the surface of the insulating layer by dry plating. For the dry plating, a publicly known method such as a vapor deposition method, a sputtering method, and an ion plating method can be used. In the vapor deposition method (vacuum deposition method), for example, a metallic film can be formed on the insulating layer by placing the multilayer printed wiring board in a vacuum container and heating and evaporating the metal. In the sputtering method as well, for example, the multilayer printed wiring board is placed in a vacuum container, an inert gas such as argon is introduced, a direct current voltage is applied, the ionized inert gas is brought into collision with the target metal, and the knocked-out metal can be used to form a metallic film on the insulating layer.

Next, a conductor layer is formed by nonelectrolytic plating or electroplating. As a method of subsequent patterning, for example, a subtractive method, a semi-additive method, or the like can be used.

<Semiconductor Device>

A semiconductor device of the present embodiment contains an insulating layer containing the resin composition of the present embodiment. In particular, it can be produced by the following method. A semiconductor device can be produced by mounting a semiconductor chip at the conduction points on the multilayer printed wiring board of the present embodiment. Here, the conduction points refer to the points in the multilayer printed wiring board where electrical signals are conveyed, and the locations thereof may be on the surface or at embedded points. In addition, the semiconductor chip is not particularly limited as long as they is an electrical circuit element made of a semiconductor.

The method for mounting the semiconductor chip upon producing the semiconductor device of the present embodiment is not particularly limited as long as the semiconductor chip effectively functions. Specific examples thereof include a wire bonding mounting method, a flip chip mounting method, a mounting method with a bumpless build-up layer (BBUL), a mounting method with an anisotropic conductive film (ACF), and a mounting method with a non-conductive film (NCF).

Alternatively, the semiconductor device can be produced by forming an insulating layer containing the resin composition of the present embodiment on a semiconductor chip or a substrate on which the semiconductor chip is mounted. The shape of the substrate on which the semiconductor chip is mounted may be wafer-like or panel-like. After the formation, the semiconductor device can be produced using the same method as the multilayer printed wiring board described above.

Example 1

[Transmittance and Absorbance]

As the maleimide compound (A), BMI-1000P (product name, $n_1$ is 13.6 (average value) in the formula (3), the mass average molecular weight (Mw) is 1,338, and the number of functional groups is 2) manufactured by K•I Chemical Industry Co., LTD. was used to prepare a chloroform solution containing this BMI-1000P (product name) at 1% by mass, and measurement of the transmittance at a wavelength of 405 nm was carried out using an UV-vis measuring apparatus (spectrophotometer U-4100 (product name) manufactured by Hitachi High-Technologies Corporation). Also, the maleimide functional group equivalent (also referred to as the "functional group equivalent") was calculated from the expression (1) described above.

In the same manner, BMI-6100 (product name, x=18 and y=18 in the formula (4), the mass average molecular weight (Mw) is 6100, and the number of functional groups is 2) manufactured by Designer Molecules Inc., BMI-689 (product name, the formula (9), the mass average molecular weight (Mw) is 689, and the number of functional groups is 2) manufactured by Designer Molecules Inc., BMI-650P (product name) ($n_1$ is 8.8 (average value) in the formula (3), the mass average molecular weight (Mw) is 1065, and the number of functional groups is 2.02) manufactured by K•I Chemical Industry Co., LTD., and BMI-250P (product name) ($n_1$ is 3 to 8 (average value) in the formula (3), and the mass average molecular weight (Mw) is 500 to 1500) manufactured by K•I Chemical Industry Co., LTD. were used as the maleimide compounds (A), and measurement of the transmittance at a wavelength of 405 nm was carried out.

In the same manner, BMI-2300 (product name) manufactured by Daiwa Kasei Industry Co., LTD. and BMI-TMH (product name, the formula (12), the mass average molecular weight (Mw) is 318, and the number of functional groups is 2) manufactured by Daiwa Kasei Industry Co., LTD. were used as the maleimide compounds (B), and measurement of the transmittance at a wavelength of 405 nm was carried out.

As the photo initiator (C), 2,4,6-trimethylbenzoyl-diphenyl-phosphine oxide (Omnirad (registered trademark) 819 (product name) manufactured by IGM Resins B.V.) was used to prepare a chloroform solution containing this Omnirad (registered trademark) 819 (product name) at 1% by mass, and measurement of the absorbance at a wavelength of 405 nm was carried out using an UV-vis measuring apparatus (U-4100 (product name)).

In the same manner, 2-benzyl-2-dimethylamino-1-(4-morpholinophenyl)-butanone-1 (Omnirad (registered trademark) 369 (product name) manufactured by IGM Resins B.V.) and 2-methyl-1-[4-(methylthio)phenyl]-2-morpholinopropan-1-one (Omnirad (registered trademark) 907 (product name) manufactured by IGM Resins B.V.) were used as the photo initiators, and measurement of the absorbance at a wavelength of 405 nm was carried out.

The results are shown in Table 1.

TABLE 1

| | | Functional group equivalent [g/eq.] | 405 nm Transmittance [%] | 405 nm Absorbance [-] |
|---|---|---|---|---|
| Maleimide compound (A) | BMI-1000P | 669 | 18 | — |
| | BMI-6100 | 3050 | 76 | — |
| | BMI-689 | 345 | 72 | — |
| | BMI-650P | 527 | 10.3 | — |
| | BMI-250P | 300 | 7.3 | — |
| Maleimide compound (B) | BMI-2300 | 275 | 0 | — |
| | BMI-TMH | 159 | 76 | — |
| Photo initiator (C) | Omnirad819 | — | — | 0.26 |
| Photo initiator | Omnirad369 | — | — | 0.04 |
| | Omnirad907 | — | — | 0 |

Example 1

[Fabrication of Resin Composition and Resin Sheet]

47.6 parts by mass of BMI-1000P (product name) as the maleimide compound (A), 47.6 parts by mass of BMI-2300 (product name) as the maleimide compound (B), and 4.8 parts by mass of 2,4,6-trimethylbenzoyl-diphenyl-phosphine oxide (Omnirad (registered trademark) 819 (product name)) as the photo initiator (C) were mixed and stirred with an ultrasonic homogenizer, thereby obtaining a varnish (solution of the resin composition). This varnish is applied onto a PET film with a thickness of 38 μm (Unipeel (registered trademark) TR1-38, manufactured by UNITIKA LTD., product name) using an auto film applicator (PI-1210 (product name) manufactured by TESTER SANGYO CO., LTD.) and heated and dried at 80° C. for 7 minutes, thereby obtaining a resin sheet having the PET film as a support and a resin layer with a thickness of 30 μm.

(Fabrication of Inner Layer Circuit Substrate)

After forming an inner layer circuit in a BT resin laminate with a glass cloth base material, both surfaces of which are copper clad (copper foil thickness of 18 μm, thickness of 0.2 mm, CCL (registered trademark)-HL832NS (product name) manufactured by Mitsubishi Gas Chemical Company, Inc.), both surfaces were subjected to roughening treatment for copper surfaces with CZ8100 (product name) manufactured by MEC Co., Ltd., thereby obtaining an inner layer circuit substrate.

(Fabrication of Resin for Evaluation)

The resin surfaces of the resin sheets described above were pasted together, and a vacuum laminator (manufactured by Nikko-Materials Co., Ltd.) was used to perform vacuum drawing (5.0 MPa or less) for 30 seconds, followed by lamination molding at a pressure of 10 kgf/cm$^2$ and a temperature of 70° C. for 30 seconds. Furthermore, by performing lamination molding at a pressure of 7 kgf/cm$^2$ and a temperature of 70° C. for 60 seconds, a resin for evaluation with supports on both surfaces was obtained.

(Fabrication of Cured Product 1 for Evaluation)

Using a manual double-sided exposure device (manufactured by ORC MANUFACTURING CO., LTD.), the resin for evaluation described above was irradiated with an active energy ray including a wavelength of 405 nm (h-line) at an irradiation amount of 1,000 mJ/cm$^2$ to expose the resin for evaluation, and after curing the resin, the supports were peeled off. Subsequently, heat treatment (postbaking) was performed at 180° C. and for 120 minutes using a clean oven (manufactured by ESPEC CORP.), thereby obtaining a cured product 1 for evaluation.

(Fabrication of Cured Product 2 for Evaluation)

Onto a reliability evaluation substrate with L (pattern width)/S (gap between patterns)=40/40 (μm), the resin surface of the resin sheet described above was placed, and a vacuum laminator (manufactured by Nikko-Materials Co., Ltd.) was used to perform vacuum drawing (5.0 MPa or less) for 30 seconds, followed by lamination molding at a pressure of 10 kgf/cm$^2$ and a temperature of 70° C. for 30 seconds. Furthermore, by performing lamination molding at a pressure of 7 kgf/cm$^2$ and a temperature of 70° C. for 60 seconds, a laminate in which the reliability evaluation substrate, the resin layer, and the support were stacked in this order was obtained.

Subsequently, using a manual double-sided exposure device (manufactured by ORC MANUFACTURING CO., LTD.), the resin layer described above was irradiated with an active energy ray including a wavelength of 405 nm (h-line) at an irradiation amount of 1,000 mJ/cm$^2$ to expose the resin layer, and after curing it, the support was peeled off. Thereafter, heat treatment (postbaking) was performed at 180° C. and for 60 minutes using a clean oven (manufactured by ESPEC CORP.), thereby obtaining a cured product 2 for evaluation having the reliability evaluation substrate.

Example 2

45.5 parts by mass of BMI-6100 (product name) as the maleimide compound (A), 45.5 parts by mass of BMI-TMH (product name) as the maleimide compound (B), and 9 parts by mass of 2,4,6-trimethylbenzoyl-diphenyl-phosphine oxide (Omnirad (registered trademark) 819 (product name)) as the photo initiator (C) were mixed and stirred with an ultrasonic homogenizer, thereby obtaining a varnish (solution of the resin composition). By using this varnish, a resin sheet was obtained in the same manner as in Example 1. Using this resin sheet, a resin for evaluation, and cured products 1 and 2 for evaluation were obtained in the same manner as in Example 1.

Example 3

A resin sheet was obtained in the same manner as in Example 2 except that 45.5 parts by mass of BMI-689 (product name) was used as the maleimide compound (A) instead of BMI-6100 (product name). By using this resin sheet, a resin for evaluation, and cured products 1 and 2 for evaluation were obtained in the same manner as in Example 1.

Example 4

A resin sheet was obtained in the same manner as in Example 1 except that 47.6 parts by mass of BMI-650P (product name) was used as the maleimide compound (A) instead of BMI-1000P (product name). By using this resin sheet, a resin for evaluation, and cured products 1 and 2 for evaluation were obtained in the same manner as Example 1.

Example 5

A resin sheet was obtained in the same manner as in Example 1 except that 47.6 parts by mass of BMI-250P (product name) was used as the maleimide compound (A) instead of BMI-1000P (product name). Using this resin sheet, a resin for evaluation, and cured products 1 and 2 for evaluation were obtained in the same manner as Example 1.

Comparative Example 1

90 parts by mass of BMI-1000P (product name) as the maleimide compound and 10 parts by mass of 2,4,6-trimethylbenzoyl-diphenyl-phosphine oxide (Omnirad (registered trademark) 819 (product name)) as the photo initiator were mixed and stirred with an ultrasonic homogenizer, thereby obtaining a varnish (solution of the resin composition). A resin sheet was obtained in the same manner as in Example 1 by using this varnish. A resin for evaluation, and cured products 1 and 2 for evaluation were obtained in the same manner as in Example 1 by using this resin sheet.

Comparative Example 2

A resin sheet was obtained in the same manner as in Comparative Example 1 except that 90 parts by mass of BMI-2300 (product name) was used as the maleimide compound instead of BMI-1000P (product name). By using this, a resin for evaluation, and cured products 1 and 2 for evaluation were obtained in the same manner as Example 1.

Comparative Example 3

A resin sheet was obtained in the same manner as in Example 1 except that 4.8 parts by mass of Omnirad (registered trademark) 369 (product name) was used as the photo initiator instead of Omnirad (registered trademark)

819 (product name). Using this, a resin for evaluation, and cured products 1 and 2 for evaluation were obtained in the same manner as Example 1.

Comparative Example 4

A resin sheet was obtained in the same manner as in Example 1 except that 4.8 parts by mass of Omnirad (registered trademark) 907 (product name) was used as the photo initiator instead of Omnirad (registered trademark) 819. A resin for evaluation, and cured products 1 and 2 for evaluation were obtained in the same manner as Example 1 by using this.

Comparative Example 5

116.9 parts by mass (76 parts by mass in terms of non-volatile portions) of a solution of TrisP-PA (propylene glycol monomethyl ether acetate of an epoxy acrylate compound) (KAYARAD (registered trademark) ZCR-6007H manufactured by Nippon Kayaku Co., Ltd., non-volatile portions 65% by mass, acid value: 70 mg KOH/g), 16 parts by mass of dipentaerythritol hexaacrylate (KAYARAD (registered trademark) DPHA manufactured by Nippon Kayaku Co., Ltd.), and 8 parts by mass of Omnirad (registered trademark) 819 (product name) as the photo initiator were mixed and stirred with an ultrasonic homogenizer, thereby obtaining a varnish (solution of the resin composition). By using this varnish, a resin sheet was obtained in the same manner as in Example 1. Then, by using this resin sheet, a resin for evaluation, and cured products 1 and 2 for evaluation were obtained in the same manner as Example 1.

Comparative Example 6

105.9 parts by mass (72 parts by mass in terms of non-volatile portions) of a bisphenol F-based epoxy acrylate (KAYARAD (registered trademark) ZFR-1553H manufactured by Nippon Kayaku Co., Ltd., non-volatile portions 68% by mass, acid value: 70 mg KOH/g), 19 parts by mass of dipentaerythritol hexaacrylate (KAYARAD (registered trademark) DPHA manufactured by Nippon Kayaku Co., Ltd.), and 9 parts by mass of Omnirad (registered trademark) 819 (product name) as the photo initiator were mixed and stirred with an ultrasonic homogenizer, thereby obtaining a varnish (solution of the resin composition). Using this varnish, a resin sheet was obtained in the same manner as in Example 1. Then, by using this, a resin for evaluation, and cured products 1 and 2 for evaluation were obtained in the same manner as Example 1.

[Measurement and Evaluation of Physical Properties]

The resins for evaluation and the cured products 1 and 2 for evaluation were measured and evaluated in accordance with the following methods. The results are shown in Table 2.

<Photocurability Test>

By using a photo DSC (DSC-2500 (brand name) manufactured by TA Instruments Japan Inc.) equipped with a light source (Omnicure (registered trademark) S2000 (product name) manufactured by U-VIX Corporation) that is capable of irradiating with an active energy ray including a wavelength of 405 nm (h-line), the obtained resin for evaluation was irradiated with an active energy ray including a wavelength of 405 nm (h-line) at an illuminance of 30 mW and for an exposure time of 3.5 minutes, thereby obtaining a graph of time (sec) on the horizontal axis and heat flow (mW) on the vertical axis. The enthalpy (J/g) was defined as the peak area when a line was drawn horizontally from the endpoint of the graph. The curability was evaluated based on enthalpy, with "AA" defined as 1 (J/g) or more and "CC" defined as less than 1 (J/g). Note that an enthalpy of 1 (J/g) or more means that the curing of the resin is sufficiently advanced by exposure with an active energy ray including a wavelength of 405 nm (h-line).

<Heat Resistance (Glass Transition Temperature) Test>

For the obtained cured product 1 for evaluation, the temperature was raised at 10° C./min using a DMA apparatus (a dynamic viscoelasticity measurement apparatus DMAQ800 (product name) manufactured by TA Instruments), and the peak position of the loss modulus was defined as the glass transition temperature (Tg, ° C.).

Note that, for the cured products 1 for evaluation obtained in Comparative Examples 1 to 4, "wrinkles" were generated in post baking. These samples could not be measured because a smooth sample is required for heat resistance measurement.

<Thermal Stability Test>

The obtained cured product 1 for evaluation was measured under the measurement conditions of measurement start temperature (20° C.), temperature increase rate (10° C./min), and target temperature (500° C.) using a differential thermogravimetric simultaneous measurement apparatus (TG-DTA6200 (product name)), and as a result, the temperature at which the weight loss percentage of the cured product 1 for evaluation reached 5% was defined as the thermal stability (° C.).

Note that for the cured products 1 for evaluation obtained in Comparative Examples 1 to 4, "wrinkles" were generated in post baking. These samples could not be measured because a smooth sample is required for thermal stability measurement.

<Insulation Reliability Test>

The obtained cured product 2 for evaluation was subjected to moisture absorption treatment for 168 hours under the conditions of 85° C. and 60% RH, followed by reflow treatment at 260° C. for three times. For the cured product for evaluation after the reflow treatment, the resistance value was measured for 400 hours under the HAST conditions (130° C., 85% RH, and 5.0 V), and the final resistance value at that time was calculated. Insulation reliability was evaluated in accordance with the following evaluation items along with a visual assessment during the measurement.

"AA": No short circuit during measurement and final resistance value of $1.0 \times 10^7$ (Ω) or more.

"BB": No short circuit during measurement and final resistance value of less than $1.0 \times 10^7$ (Ω).

"CC": Short circuit occurred during measurement.

Note that for the cured products 2 for evaluation obtained in Comparative Examples 1 to 4, "wrinkles" were generated in post baking. These samples could not be measured since a smooth sample is required for thermal stability measurement.

TABLE 2

| | | Example 1 | Example 2 | Example 3 | Example 4 | Example 5 | Comparative Example 1 | Comparative Example 2 | Comparative Example 3 | Comparative Example 4 | Comparative Example 5 | Comparative Example 6 |
|---|---|---|---|---|---|---|---|---|---|---|---|---|
| Maleimide compound (A) | BMI-1000P | 47.6 | | | | | 90 | | 47.6 | 476 | | |
| | BMI-6100 | | 45.5 | | | | | | | | | |
| | BMI-689 | | | 45.5 | | | | | | | | |
| | BMI-650P | | | | 47.6 | | | | | | | |
| | BMI-250P | | | | | 47.6 | | | | | | |
| Maleimide compound (B) | BMI-2300 | 47.6 | | | 47.6 | 47.6 | | 90 | 47.6 | 47.6 | | |
| | BMI-TMH | | 45.5 | 45.5 | | | | | | | | |
| Acrylate | ZCR-6007H | | | | | | | | | | 76 | |
| | ZFR-1553H | | | | | | | | | | | 72 |
| | DPHA | | | | | | | | | | 16 | 19 |
| Photo initiator (C) | Omnirad819 | 4.8 | 9 | 9 | 4.8 | 4.8 | 10 | 10 | | | 8 | 9 |
| Photo initiator | Omnirad369 | | | | | | | | | 4.8 | | |
| | Omnirad907 | | | | | | | | | | 4.8 | |
| Evaluation results | Photocurability | AA | AA | AA | AA | AA | AA | CC | CC | CC | AA | AA |
| | Heat resistance (Tg, °C) | 155 | 134 | 130 | 160 | 158 | 110 | — | — | — | 99 | 93 |
| | Thermal stability (°C) | 297 | 237 | 229 | 301 | 299 | 199 | — | — | — | 175 | 172 |
| | Insulation reliability | AA | AA | AA | AA | AA | AA | — | — | — | BB | CC |

As is evident from Table 2, the resin compositions of the present embodiments are light-sensitive and are capable of being photo-cured when exposed with an active energy ray including a wavelength of 405 nm (h-line). It is also found that the resin compositions of the present embodiment can provide cured products having excellent heat resistance, thermal stability, and insulation reliability.

The present application is based on Japanese Patent Application No. 2018-161792 filed on Aug. 30, 2018, the contents of which are incorporated herein by reference.

INDUSTRIAL APPLICABILITY

The resin composition of the present invention is light-sensitive and photocurable when exposed with an active energy ray including a wavelength of 405 nm (h-line) and has excellent photocurability, heat resistance, thermal stability, and insulation reliability, especially when used for multilayer printed wiring boards. Therefore, it is suitable for applications where an insulating resin composition is required. Examples of such applications include, for example, a photosensitive film, a photosensitive film with a support, an insulating resin sheet such as a prepreg, a circuit substrate (applications for a laminate, applications for a multilayer printed wiring board, and the like), a solder resist, an underfill material, a die bonding material, a semiconductor sealing material, a hole filling resin, and a component embedding resin.

The invention claimed is:

1. A resin composition comprising:
   a maleimide compound (A) having a maleimide functional group equivalent of 300 g/eq. or more, and a transmittance of 1% or more at a wavelength of 405 nm (h-line);
   a maleimide compound (B) having a maleimide functional group equivalent of less than 300 g/eq.;
   a photo initiator (C) having an absorbance of 0.1 or more at a wavelength of 405 nm (h-line),
   wherein the resin composition is light-sensitive and photocurable when exposed with an active energy ray at a wavelength of 405 nm (h-line),
   wherein a compounding ratio between the maleimide compound (A) and the maleimide compound (B) ((A):(B)) is 5 to 95:95 to 5 on a mass basis
   wherein the photo initiator (C) is a compound represented by the following formula (1):

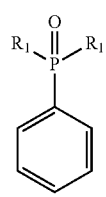

(1)

wherein each $R_1$ independently represents a substituent represented by the following formula (2) or a phenyl group:

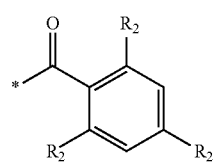

(2)

wherein, -* shows a bonding site, and each $R_2$ independently represents a hydrogen atom or a methyl group.

2. The resin composition according to claim 1, wherein a content of the maleimide compound (A) and the maleimide compound (B) is 50 to 99.9 parts by mass based on 100 parts by mass in total of the maleimide compound (A), the maleimide compound (B), and the photo initiator (C).

3. A resin sheet comprising:
a support; and
a resin layer disposed on one surface or both surfaces of the support,
wherein the resin layer comprises the resin composition according to claim 1.

4. The resin sheet according to claim 3, wherein the resin layer has a thickness of 1 to 50 μm.

5. A multilayer printed wiring board comprising the resin composition according to claim 1.

6. A semiconductor device comprising the resin composition according to claim 1.

* * * * *